(12) United States Patent
Seevinck et al.

(10) Patent No.: US 12,181,550 B2
(45) Date of Patent: Dec. 31, 2024

(54) METHOD FOR GENERATING A MAGNETIC RESONANCE SYNTHETIC COMPUTER TOMOGRAPHY IMAGE

(71) Applicant: MRIGUIDANCE B.V., Utrecht (NL)

(72) Inventors: Peter Roland Seevinck, Utrecht (NL); Frank Zijlstra, Utrecht (NL)

(73) Assignee: MRIGUIDANCE B.V., Utrecht (NL)

( * ) Notice: Subject to any disclaimer, the term of this patent is extended or adjusted under 35 U.S.C. 154(b) by 0 days.

(21) Appl. No.: 18/005,047

(22) PCT Filed: Jul. 12, 2021

(86) PCT No.: PCT/EP2021/069342
§ 371 (c)(1),
(2) Date: Jan. 10, 2023

(87) PCT Pub. No.: WO2022/008759
PCT Pub. Date: Jan. 13, 2022

(65) Prior Publication Data
US 2024/0295619 A1 Sep. 5, 2024

(30) Foreign Application Priority Data
Jul. 10, 2020 (NL) .................................... 2026047

(51) Int. Cl.
*G01R 33/48* (2006.01)
*G01R 33/50* (2006.01)
(52) U.S. Cl.
CPC ..... *G01R 33/4828* (2013.01); *G01R 33/4812* (2013.01); *G01R 33/50* (2013.01)

(58) Field of Classification Search
CPC ............ G01R 33/4828; G01R 33/4812; G01R 33/50
See application file for complete search history.

(56) References Cited

U.S. PATENT DOCUMENTS

2002/0087070 A1\* 7/2002 Foo .................... G01R 33/5601
600/420

FOREIGN PATENT DOCUMENTS

WO 2012112409 A2 8/2012

OTHER PUBLICATIONS

Berglund, J. et al., "Two-point Dixon Method with Flexible Echo Times," Magnetic Resonance in Medicine, vol. 65, No. 4, Apr. 2011, Available Online Nov. 16, 2010, 11 pages.

(Continued)

*Primary Examiner* — G. M. A Hyder
(74) *Attorney, Agent, or Firm* — McCoy Russell LLP

(57) ABSTRACT

A method is disclosed for generating a contrast image using MRI comprising a four-echo steady state free precession (SSFP) sequence. The method comprises:
  generating a pulse train of excitation pulses having a repetition time;
  generating between two subsequent excitation pulses of the pulse train a first S+ echo; a second S+ echo; a first S– echo; and a second S– echo
  sampling between the two subsequent excitation pulses the first S+ echo; the second S+ echo; the first S– echo; and the second S– echo;
  generating the contrast image based on the sampled first S+ echo, the sampled second S+ echo, the sampled first S– echo, and the sampled second S– echo.

19 Claims, 10 Drawing Sheets

(56) References Cited

OTHER PUBLICATIONS

Kapanen, M. et al., "T1/T2—weighted MRI provides clinically relevant pseudo-CT density data for the pelvic bones in MRI-only based radiotherapy treatment planning," Acta Oncologica, vol. 52, No. 3, Apr. 2013, 7 pages.

Cheng, C. et al., "Dual-pathway multi-echo sequence for simultaneous frequency and T2 mapping," Journal of Magnetic Resonance, vol. 265, Apr. 2016, Available Online Feb. 4, 2016, 28 pages.

Chaudhari, A. et al., "Imaging and T2 Relaxometry of Short-T2 Connective Tissues in the Knee using Ultrashort Echo-Time Double-Echo Steady-State (UTEDESS)," Magnetic Resonance in Medicine, vol. 78, No. 6, Dec. 2017, Available Online Jan. 11, 2017, 13 pages.

Sveinsson, B. et al., "A simple analytic method for estimating T2 in the knee from DESS," Magnetic Resonance Imaging, vol. 38, May 2017, Available Online Dec. 23, 2016, 8 pages.

Alaia, E. et al., "Comparison of a fast 5-min knee MRI protocol with a standard knee MRI protocol: a multi-institutional multi-reader study," Skeletal Radiology, vol. 47, No. 1, Jan. 2018, Available Online Sep. 26, 2017, 10 pages.

Chaudhari, A. et al., "Combined 5-minute Double-Echo in Steady-State With Separated Echoes and 2-Minute Proton-Density-Weighted 2D Fse Sequence for Comprehensive Whole-Joint Knee MRI Assessment," Journal of Magnetic Resonance Imaging, vol. 49, No. 7, Jun. 2019, Available Online Dec. 23, 2018, 12 pages.

Zijlstra, F. et al., "Multiple-echo steady-state (MESS): Extending DESS for joint T2 mapping and chemical-shift corrected water-fat separation," Magnetic Resonance in Medicine, vol. 86, No. 6, Jul. 16, 2021, 10 pages.

ISA European Patent Office, International Search Report Issued in Application No. PCT/EP2021/069342, Nov. 9, 2021, WIPO, 3 pages.

\* cited by examiner

METHOD FOR GENERATING A MAGNETIC RESONANCE SYNTHETIC COMPUTER TOMOGRAPHY IMAGE

CROSS REFERENCE TO RELATED APPLICATIONS

The present application is a U.S. National Phase of International Application No. PCT/EP2021/069342 entitled "FOR GENERATING A MAGNETIC RESONANCE SYNTHETIC COMPUTER TOMOGRAPHY IMAGE," and filed on Jul. 12, 2021. International Application No. PCT/EP2021/069342 claims priority to Dutch Patent Application No. 2026047 filed on Jul. 10, 2020. The entire contents of each of the above-listed applications are hereby incorporated by reference for all purposes.

FIELD OF THE INVENTION

The invention relates to a method for generating MRI data and in particular to methods for generating a contrast image using MRI data. Furthermore, the invention relates to a control device for controlling a magnetic resonance imaging device, an assembly of a magnetic resonance imaging apparatus and the control device, and to a software program.

BACKGROUND OF THE INVENTION

Magnetic resonance imaging (MRI) is a medical imaging technique used in radiology to form pictures of the anatomy and the physiological processes of the body. MRI scanners use strong magnetic fields, magnetic field gradients, and radio waves to generate images of the organs in the body.

X-ray computed tomography (CT) is a medical imaging method that assesses the radiodensity of tissue. As such it is well suited to discriminate bone from soft tissues, however, it is less well suited to discriminate different soft tissue types like muscle, cartilage and ligaments and nerves.

MRI is superior in generating soft tissue contrasts, using a multitude of different scan protocols. In clinical practice an MRI scan protocol often consists of 3 to 6 scans with each different settings to highlight different aspects. This may cause MRI scans to take between 15-30 minutes, which may render MRI an expensive modality. Furthermore, it may make MRI sensitive to motion.

An MRI sequence is a number of radiofrequency pulses and gradients that result in a set of images.

Some examples of MRI sequences are briefly described below.

A three-dimensional double-echo steady-state (3D-DESS) sequence uses a 3D gradient echo technique which allows simultaneous acquisition of two separate steady state free precession (SSFP) echoes with entirely different contrasts (FISP sequence and PSIF sequence). In some applications, both echo signals are combined into one image by applying a sum of squares calculation to both echoes. The FISP part provides representative morphological images with mixed T1/T2 weighted contrast, whereas the PSIF part of the sequence provides increased T2-weighted contrast. The combined data produce a higher T2 weighted image which is more sensitive and specific in cartilage and synovial fluid imaging.

Steady-state free precession imaging (SSFP MRI) is an MRI technique which uses steady states of magnetizations. In general, SSFP MRI sequences are based on a (low flip angle) gradient-echo MRI sequence with a short repetition time which in its generic form has been described as the FLASH MRI technique. While spoiled gradient-echo sequences refer to a steady state of the longitudinal magnetization only, SSFP gradient-echo sequences include transverse coherences (magnetizations) from overlapping multi-order spin echoes and stimulated echoes. This is usually accomplished by refocusing the readout-encoding (frequency encoding) gradient in each repetition interval in order to keep the phase integral (or gradient moment) constant. Fully balanced SSFP MRI sequences achieve a phase of zero by refocusing all imaging gradients.

In magnetic resonance imaging, acquisition times tend to be long, in particular when data is to be obtained to enable to generate multiple images. The long acquisition times may result in discomfort for a patient, as the patient is required to remain in a same position for a relatively long time. Moreover, the long acquisition times result in high per patient costs and long waiting times, as only a relatively low number of patients may be imaged per day.

Multiple scan sessions (e.g. an MRI scan and a CT scan) and long MRI scan time due to the necessity of multiple MRI scans, e.g. for different contrasts and image types, may further increase imaging time, patient discomfort and cost.

The invention aims to provide a magnetic resonance imaging sequence that enables to derive a magnetic resonance imaging dataset with a relatively short acquisition time, the dataset enabling to derive a variety of images.

SUMMARY OF THE INVENTION

According to an aspect of the invention, there is provided a method for generating a contrast image using MRI comprising a four-echo steady state free precession, SSFP, sequence, the method comprising:
  generating a pulse train of excitation pulses having a repetition time;
  generating between two subsequent excitation pulses of the pulse train a first S+ echo; a second S+ echo; a first S− echo; and a second S− echo;
  sampling between the two subsequent excitation pulses the first S+ echo; the second S+ echo; the first S− echo; and the second S− echo;
  generating the contrast image based on the sampled first S+ echo, the sampled second S+ echo, the sampled first S− echo, and the sampled second S− echo.

According to the present disclosure, at least one contrast image is derived from the four echo steady state free precession sequence. The at least one contrast image may be any suitable contrast image, such as T1w, T2w, mixed T1/T2w, T1−w (W,F, IP, OP),T2−w (W,F, IP, OP), generic T2map, water T2map, fat T2map, T2*map, synthetic CT, B0.

A train, i.e. a repetition of excitation pulses, i.e. radio frequency pulses, is generated, the excitation pulses are regularly spaced in time. The excitation pulses may be slice selective, slab selective or non-selective, e.g. when generating 3D MRI data.

A multiple echo steady state sequence (MESS) may enable the generation of multiple MRI reconstructions with different contrast weightings, and may simultaneously facilitate boneMRI (i.e. synthetic CT) reconstruction.

Any item may be imaged by the above method, such as a body of a human or animal, a body part of a human or animal, etc.

A spoiled dual echo gradient echo sequence is often used for T1w morphological imaging, synthetic CT (sCT) generation, B0 field mapping or T2* quantification. When leaving out the spoiling, the dual echo gradient echo contrast will be determined by both T1 and T2 weighting, hence the name mixed T1/T2w weighted (T1/T2w). By extending an unspoiled dual echo gradient echo sequence, with two spin-echo like S− echoes, two T2w images are added, providing the possibility to perform T2 mapping and the possibility to perform water-fat decomposition. This also allows for the reconstruction of images resembling fat-suppressed DESS images, without the need for a fat-suppressed excitation. Furthermore, the T2w S− images can be combined with mixed T1/T2w S+ images to manipulate the relative amount of the T1 and T2 weightings. Additionally the four-echo Multiple Echo Steady State (MESS) sequence provides contrasts which have appeared to be very suitable for training of a sCT machine learning model and for synthetic CT reconstruction using existing machine learning models.

The MESS sequence, in combination with a non-selective excitation pulse, enables the generation of T1w, T2w, mixed T1/T2w, T2 mapping, water fraction (W), fat fraction (F), in phase (IP), opposed phase (OP) and synthetic CT contrast images, and all other contrast obtainable with multi-gradient echo data (B0 maps, R2* maps and magnetic susceptibility, Chi, maps), using a single multi-echo MRI experiment.

Gradient echo (GRE) sequences are composed of regularly spaced series of radiofrequency (RF)-pulses repeated at time interval TR. These RF-pulses are often chosen to have flip angles ($\alpha$) less than 90°, but can have any value.

Each RF-pulse generates a free induction decay (FID) signal immediately after it is applied. The FID decays with time constant T2* that reflects both intrinsic T2-relaxation plus accelerated signal loss due to magnetic field inhomogeneities, known as T2' effects.

Each pair of RF-pulses generates spin echo (SE) signals, which, because of regular spacing of the RF-pulse train, may form and rise to a maximum exactly a the time of the next RF-pulse. Each set of three RF-pulses may also generate stimulated echoes (STEs) that may coincide with the spin echoes. The "Spin Echo" portion may be mostly T2-weighted with fewer T2* effects.

After many RF-pulses the two signal components may reach a steady-state and may begin to lose their original identities as discrete FIDs and SE/STEs. In fact, both may result from the summation of echoes and magnetization created from multiple prior cycles. For this reason they may be denoted as S+ and S−, or use more generic terms such as "post-excitation" and "pre-excitation" signals, respectively. Alternatively, they may be denoted as "FIDs" and "Echoes". The post excitation, i.e. S+, echoes are generated in a first half of the repetition time between subsequent excitations, i.e. in the first half of the repetition time after each excitation, while the pre excitation, i.e. S−, echoes are generated in a second half of the repetition time between subsequent excitations, i.e. in the half of the repetition time immediately preceding the subsequent one of the excitations, thus effectively being "pre excitation" of the subsequent one of the excitations.

Either of the signals generated by the RF-pulse train ("FIDs" or "Echoes") may be temporarily suppressed and then made to reappear at a chosen echo time (TE) by application of an external magnetic gradient field. The gradient may be typically applied in two steps: 1) a dephase portion that forces spins out of phase, and 2) a rephase portion that brings them back into phase as the GRE. Thus, within a FID signal envelope defined by the T2* decay, a dephasing gradient may provide for a suppression of signal, followed by a rephrasing gradient that restores the signal towards the T2* decay signal envelope.

By changing the timing, strength, and duration of the gradients it may be possible to refocus either the "FID", the "Echo", or both at a specified time as the GRE. This may be possible because the dephasing gradient field simply "scrambles" the spin phases in a predictable, organized fashion. By reversing this gradient the signal may be regenerated (except for T2' decay) by enforcing phase coherence.

The S+ data provide images mainly containing signal form the free induction decay (FID) which are mainly T1 weighted when using small flip angle and short repetition time. Some T2* weighting is present because of the T2* decay during the time period between excitation and the center of the read-out gradient, which is referred to as the echo time (TE), and some T2 weighting is present because of contributions from spin-echo like signal from one or more previous excitations. The T2(*) weightings can be kept small by choosing small echo times and by enabling spoiler gradients in the phase and/or slice encoding directions.

An SSFP may be created by a GRE with echo refocusing.

The sampled first S+ echo; second S+ echo; first S− echo; and second S− echo may be k-space data. As 4 echoes are generated and sampled, data is registered in 4 k-spaces. As a result of filling multiple k spaces in a single repetition within a single experiment, a sensitivity towards movement by the patient may be reduced. Furthermore, the images related to the 4 k-spaces will be intrinsically spatially registered and can therefore be combined to adapt respective contrast weightings without the need for image registration.

The generation of the contrast image based on the sampled first S+ echo, the sampled second S+ echo, the sampled first S− echo, and the sampled second S− echo may enable to collect a dataset, e.g. fill plural k-spaces, that enables to derive therefrom one or more of a set of contrast images. The contrast image is generated based on the sampled first S+ echo, the sampled second S+ echo, the sampled first S− echo, and the sampled second S− echo. For example, the contrast image may be generated from any combination of the sampled first S+ echo, the sampled second S+ echo, the sampled first S− echo, and the sampled second S− echo. Thus, having collected the dataset, any desired one of the contrast images may be determined therefrom, e.g. at a later moment in time. Thus should a need for another contrast image, e.g. from a same body area, come up at a later moment in time, e.g. after having evaluated an initially determined contrast image, the other contrast image may be determined from the dataset, i.e. without the need to subject the patient to a further scan, e.g. by a different type of imaging modality. As the images in the datasets are intrinsically registered, any operation on these images can be fulfilled, without the need for image registration, including summation, subtraction, exponential fitting or any analytical, linear or nonlinear combination of images. These operation can also be performed by using (pre-trained) machine learning methods including regression-based methods, deep learning-based methods, including convolutional neural networks, attention-aware networks, generative adversarial networks, graph convolutional networks.

The contrast image comprises a synthetic Computer Tomography, CT, image.

The method comprises, between the two subsequent excitation pulses, generating a readout gradient of the first S+ echo and a readout gradient of the second S+ echo, wherein the readout gradients of the first and second S+ echo have opposite polarities, and wherein a time integral of the readout gradient of the first S+ echo and a time integral of the readout gradient of the second S+ echo have a same absolute value, generating a readout gradient of the first S− echo and a readout gradient of the second S− echo, wherein the readout gradients of the first and second S− echo have opposite polarities, and wherein a time integral of the readout gradient of the first S− echo and a time integral of the readout gradient of the second S− echo have a same absolute value, wherein the readout gradient of a latest of the first and second S+ echo's and the readout gradient of an earliest of the first and second S− echo's have a same polarity and a same value of the time integral, generating a dephasing gradient in a readout direction before an earliest of the first and second S+ echo's, and generating a rephasing gradient in the readout direction after a latest of the first and second S− echo's, wherein a time integral of the readout gradients, the dephasing gradient and the rephasing gradient over the repetition time provides for one cycle of dephasing per voxel.

As the readout gradients of the first S+ echo and the second S+ echo have an opposite polarity, a rewinding gradient between these echo's may be omitted, hence reducing a time in between these echo's. A same applies to the opposite polarities of the first S− echo and second S− echo. Further a time integral of the readout gradients of the first and second S+ echo's is the same in absolute terms. Given the opposite polarities, the time integrals of the readout gradients will have an opposite sign. Thus, when depicting the readout gradient on a time curve, an area below the curve will be the same for the first and second S+ echo. A same applies to the time integrals of the readout gradients of the first and second S− echo's. In other words, when graphically depicting the readout gradients versus time, i.e. depicting gradient field strength versus time, the areas under the curve of the respective readout gradients versus time are the same.

It is noted that the expression "readout gradient of an echo" is to be understood as the readout gradient that results in a phase relation that makes the echo to occur, i.e. the readout gradient associated with the echo. Accordingly, the readout gradients of the first and second S+ echo's respectively provide the first and second S+ echo's to appear. The readout gradients of the first and second S−echo's respectively provide the first and second S− echo's to appear.

The readout gradient of the S+ echo and the readout gradient of the S− echo that are most proximate to each other in time, i.e. the readout gradient of the latest in time of the S+ echo's and the readout gradient of the earliest in time of the S− echo's have a same polarity. Thus, the readout gradients of the S+ S+ S− S− echo's may be polarized as negative, positive, positive, negative or as positive, negative, negative, positive. As a result of the same polarity, the echo's change from S+ echo to S− echo. The terms earliest and latest echo are to be understood as earliest in time respectively latest in time, seen in a repetition time between two successive excitation pulses. Similarly, the terms before an echo and after an echo are to be understood as before an echo and after an echo, in the repetition time between the two successive excitation pulses.

A dephasing gradient is provided before the earliest of the first and second S+ echo's, i.e. before the readout gradient of the earliest of the first and second S+ echo's.

A rephasing gradient is provided after the latest of the first and second S− echo's, i.e. after the readout gradient of the latest of the first and second S− echo's.

As the readout gradients of the S+ echo's have pairwise opposite polarities and a same absolute integral, i.e. a same area under the time curve, a net dephasing by these readout gradients is zero. A same applies to the readout gradients of the S− echo's.

A net dephasing over the repetition time between the two successive excitation pulses, as a result of a combined effect of the dephasing gradient and the rephasing gradient(s) is one cycle of dephasing, more particularly one cycle of dephasing per voxel.

As a result, a highly time compacted sequence is obtained which provides for two S+ echo's and two S− echo's in each repetition time. Two S+ echo's are detected having a low T2 weighting, and two S− signals having a high T2 weighting. As a result, T2 may be estimated from a ratio between the S+ echo amplitude and S− echo amplitude. Moreover, as a result of the plural S+ echo's and S− echo's, a water-fat separation may be performed from the obtained echo's. For example, a water-fat separation may be performed using the dual S+ echo's. The obtained image data may be used to generate a synthetic Computer Tomography, CT, image, also identified as a synthetic CT contrast image or as a synthetic CT reconstruction. The S+, S+, S− and S− echo's may provide a highly versatile dataset, which may comprise T1w, T2w, water, fat, in-phase, opposed phase type of contrasts. Moreover, as the dataset may be obtained from a single acquisition, the images may be intrinsically registered with each other, which may avoid errors due to scaling, matching, movement of the person in between acquisitions, etc. The obtained data may be used for training of a synthetic CT algorithm and/or for using a trained synthetic CT algorithm to generate a synthetic CT image. As a further example, use may be made of known synthetic CT algorithms that are trained using dual S+ data. The synthetic CT contrast image may be derived from various combinations of one or more the two S+ echo's and the two S− echo's, such as:

First S+ echo (F1)
Second S+ echo (F2)
First and second S+ echo (FF)
First and second S− echo (PP)
First and second S+ echo and one of the S− echo's (FFP)
First and second S+ echo and first and second S− echo (FFPP).

In an embodiment, a readout polarity of the first S+ echo is opposite to a readout polarity of the second S+ echo and a readout polarity of the first S− echo is opposite to a readout polarity of the second S− echo. I.e., the readout gradients of the first S+ echo and the second S+ echo have an opposite polarity and the readout gradients of the first S− echo and the second S− echo have an opposite polarity. Thereby, the time between these echo can be kept relatively small which may be favorable for water-fat decomposition, and for keeping the repetition time relatively small when desired. The application of a rewinding gradient may be avoided, thereby saving the time that would have been required otherwise to apply the rewinding gradient.

Furthermore, the opposite readout polarity may reverse the direction in which k-space is traversed. This may be done for the sake of efficiency as it may be more efficient to acquire signal with opposite read-gradient polarities to traverse k-space in opposing directions while acquiring the NMR signal, than to acquire the NMR signal while traversing k-space in one direction, go back in k-space as fast as possible using a gradient with opposite polarity, and then acquire signal in the initial direction again, as identified as the use of a flyback gradient in some applications.

In an embodiment, the contrast image comprises a water-fat separation image, the water-fat separation image being determined using the first and second S+ echo's.

The water-fat separation image may be derived from the two S+ echo's. A synthetic Computer Tomography, CT, image may be reconstructed from the water-fat separation image, e.g. a Dixon water-fat separation image. Moreover, the water-fat separated images may be valuable for diagnostic purposes.

Specifically, the water-fat separation image may be determined further using at least one of the first and second S− echo's. Additionally using S− echo's, i.e. combining the S+ echo's and S− echo's may provide for a stable image decomposition.

More specifically, a T2w image may be derived from at least one of the first and second S− echo's, a synthetic Computer Tomography image being reconstructed from the T2w image and the water-fat separation image. Using the water-fat separated images and the T2w image, a high quality synthetic Computer Tomography image may be reconstructed.

A relatively low strength rephasing gradient may be provided between the latest of the first and second S+ echo's and the earliest of the first and second S− echo's. The latter rephasing gradient may compensate a trailing ramp of the readout gradient of the latest of the S+ echo's and a leading ramp of the readout gradient of the earliest of the S− echo's.

In an embodiment the contrast image comprises any contrast image from a group of contrast images comprising:
  a T1w image,
  a T2w image,
  a mixed T1/T2w image,
  a water fraction image,
  a fat fraction image,
  an in-phase image,
  an opposed-phase image,
  a T2 map water,
  a T2 map fat,
  a T2map general (i.e. of all tissue), and
  a T2* map general (i.e. of all tissue).

The T1w image may be derived from the first S+ or second S+ echo.

The T2w image may be derived from the first S− or second S− echo.

The mixed T1/T2w image may be derived from at least one of the first S+ and the second S+ echo on the one hand and from at least one of the first S− and the second S− echo on the other hand.

The following images may be derived from all 4 echo's, using Dixon reconstruction (and, where applicable, T2 mapping for the T2 maps)
  the water fraction image,
  the fat fraction image,
  the in-phase image,
  the opposed-phase image,
  the T2 map water, and
  the T2 map fat.

The T2map general, and T2*map general may be derived from the first S+ and second S− echoes (i.e. echo 1 and echo 4) or from the second S+ and first S− echoes (i.e. echo 2 and 3).

The first S+ echo may be identified as echo 1, the second S+ echo may be identified as echo 2, the first S− echo may be identified as echo 3 and the second S− echo may be identified as echo 4.

The contrast images, such as the contrast images comprised in the above mentioned group of contrast images may, in the present document, also be identified as images.

As a result of the plural echo's generated with the MRI sequence, plural k-spaces may be filled, the data as derived from the echo's, e.g. the data in the plural k-spaces, enabling to derive each one of the group of contrast images therefrom. As any one of the contrast images in the group may be derived from the obtained echo's, any desired contrast image from the group of contrast images may be obtained (i.e. derived) from one or more of the echo's.

The contrast image may be generated based on the sampled first S+ echo, the sampled second S+ echo, the sampled first S− echo, and the sampled second S− echo. The generation of the contrast image based on the sampled first S+ echo, the sampled second S+ echo, the sampled first S− echo, and the sampled second S− echo may encompass generating the contrast image from at least one of the sampled first S+ echo, the sampled second S+ echo, the sampled first S− echo, and the sampled second S− echo. Thus, the contrast image may be generated from one of the sampled first S+ echo, the sampled second S+ echo, the sampled first S− echo, and the sampled second S− echo, from two of the sampled first S+ echo, the sampled second S+ echo, the sampled first S− echo, and the sampled second S− echo, from three of the sampled first S+ echo, the sampled second S+ echo, the sampled first S− echo, and the sampled second S− echo or from all four of the sampled first S+ echo, the sampled second S+ echo, the sampled first S− echo, and the sampled second S− echo.

The group of contrast images may further comprise
  a B0 map,
  an R2* map, and
  a Chi map.

The data as derived from the echo's, e.g. the data in the plural k-spaces, may further enable to derive each one of the B0 map, the R2* map, and the Chi map.

The B0 map may be derived from the S+ echoes or from the S+ echoes and the S− echoes.

The R2* map and Chi map may be derived from the S+ echoes.

One or a plurality of images (e.g. at least two contrast images) from the above group may be derived from the sampled echoes.

More generally, the contrast images may comprise:
  The 'regular' magnitude images per echo.
  Water-fat decomposed images, which may be generated using Dixon or IDEAL type spectral analysis techniques: Water, Fat, IP, OP images.
  Quantitative relaxometry maps. T2 (water, fat, generic) and T2* (generic). These are maps providing per voxel a value of a relaxation parameter, such as T2 and T2*.
  Phase based maps, such as B0 map, a phasor or dChi (magnetic susceptibility) map.
  Synthetic CT reconstructions. Synthetic CT reconstructions may be derived from the echoes and/or images, as they comprise various contrasts that relate to tissue types to be distinguished in CT (e.g. water, fat, bone). The various contrasts make this data suitable for deep learning techniques performing MRI to CT image synthesis. As such, the images can be used to train machine learning models. The images can also be used to reconstruct sCT images using existing machine learning models.

Accordingly, in an embodiment, referring to the contrast images, the contrast image may comprises any contrast image from a group of contrast images comprising:
  a magnitude image per echo, a water-fat decomposed image,
a quantitative relaxometry map,
a phase based map, and
a synthetic CT reconstruction.

Likewise, in an embodiment, the contrast image may comprises any contrast image from a group of contrast images comprising:
a water-fat decomposed image,
a quantitative relaxometry map,
a phase based map, and
a synthetic CT reconstruction.

One or a plurality of contrast images (e.g. at least two contrast images) from the above group may be derived from the sampled echoes.

In an embodiment, at least two contrast images from the group of contrast images are generated based on the sampled first S+ echo, the sampled second S+ echo, the sampled first G− echo, and the sampled second S− echo.

An overview of possible images as may be derived from the MRI sequence, is provided in the below table:

In the table, F1 refers to the first FISP (S+) image obtained from the first S+ echo, F2 refers to the second FISP (+) image obtained from the second T+ echo, FE refers to both FISP images, P1 refers to the first PSIF (5−) image obtained from the first S−echo, P2 refers to the second PSIF (5−) image obtained from the second D− echo, PP refers to both PSIF images.

| type of image | source images | reconstructed images | type of contrast | Remark |
|---|---|---|---|---|
| F1 | T1/T2w Gradient echo unspoiled | sCT | mainly T1w, minor T2*w | |
| F2 | T1/T2w Gradient echo unspoiled | sCT | mainly T1w, minor T2*w | For example, more T2*w than F1 may enable T2* mapping |
| FF | | dixon reconstructed Water, W Fat, F In Phase, IP Out-of-Phase, OP B0 sCT | mainly T1, minor T2*w | |
| P1 | spin echo images | — | same T1w and T2*w as F2, major T2w and more diffusion weighted | |
| P2 | spin echo images | — | same T1w and T2*was F2, major T2w and more diffusion weighted | |
| PP | spin echo images | dixon reconstructed Water, W Fat, F In Phase, IP Out-of-Phase, OP B0 sCT | same T1w and T2*was F2, major T2w and more diffusion weighted | |
| FFP | | all images FF generic T2 map# sCT | | Single sequence, short TR. T1w, T2w, T1-w (W,F, IP, OP), generic |
| FFPP | | all images above + T2 maps# of water, of fat and generic | | T2map sCT, B0 Single sequence, short TR. T1w, T2w, T1-w (W,F, IP, OP),T2-w (W,F, IP, OP), generic T2map, water T2map, fat T2map, sCT, B0 |

T2 maps require T2 mapping requiring a FISP and PSIF image, according to Sveinsson et al. ( Sveinsson B, Chaudhari AS, Gold GE, Hargreaves BA. A simple analytic method for estimating T2 in the knee from DESS. Magn. Reson. Imaging 2017; 38:63-70 doi: 10.1016/j.mri.2016.12.018.).

Thus, the described MRI sequence enables to derive a variety of contrast images. As a result, using the MRI sequence, a dataset may be generated, for example associated with a body part of a patient, and any desired image from the plural images may be generated therefrom, e.g. at a later moment in time. As a result, a wide range of available contrast images may be derived from the echo data generated by a single MRI sequence.

As the MRI sequence enables the reconstruction of a multitude of desired MRI contrasts as well as radiodensity contrast, the scan time for performing the MRI scan of the patient may be reduced, and a further CT scan may be omitted.

The two F echo images themselves may be diagnostically useful T1/T2w images, with different water-fat interferences. Gradient echo images may be sensitive to off-resonance effects (field inhomogeneities, chemical shifts), and as a result the 2 subsequent F images will be influenced differently by off-resonance effects. By choosing the echo times such that the phase of water and fat is sufficiently different in the two echoes, it may be possible to use these two F images for 2-point Dixon water-fat decomposition Ideally, the phase difference between water and fat will be 180 degrees, which, for example, at 1.5 T is associated with a difference in echo time between echo 1 and 2 of approximately 2.3 ms, and at 3 T is associated with a difference in echo time of approximately 1.1 ms or approximately 3.4 ms.

The two F images may provide 4 different images: water, fat, in-phase (IP) and opposed phase (OP) images. These images are also useful from a diagnostic perspective.

Furthermore, the water-fat decomposition yields a B0 map.

The water image reconstructed from the two F images may be similar in properties to the F image of a DESS image obtained with water-selective excitation. In that sense, MESS may provide the same information as DESS in terms of water-selective imaging.

The P images may have long effective echo times and therefore may have much more T2 weighting. This T2w signal may be conserved due to the fact that the sequence is not spoiled. This type of echo is known as a stimulated echo in the MRI community. This longer echo time in combination with the encoding gradients may also cause more diffusion weighting, which may be partially controlled with the spoiler gradient (i.e. less spoiling equals less diffusion weighting).

By design, the two P images may have the same echo time difference as the F images and may therefore also be used for 2-point Dixon water-fat decomposition, which may result in T2 weighted water, fat, IP and OP images.

In an embodiment, a time between the first S+ echo and the second S− echo is equal to a time between the second S+ echo and the first S− echo. In an embodiment, a time between the excitation pulse and an earliest one of the S+ echoes following the excitation pulse is equal to a time between a latest one of the S− echoes and the subsequent excitation pulse.

In an embodiment, a time between the earliest one of the S+ echoes and a latest one of the S+ echoes in the repetition time between subsequent excitation pulses is equal to a time between an earliest one of the S− echoes and the latest one of the S− echoes in the repetition time between the subsequent excitation pulses.

As a result of the symmetry in time, a calculation associated with the generation of the contrast images may be facilitated. The symmetry may ensure that the dominant difference between echo 1 and 4 is a T2 decay. Similarly, the symmetry may ensure that the dominant difference between echo 2 and 3 is a T2 decay. In an asymmetric sequence there is also a water/fat phase difference and T2* difference, which may make water-fat separation and T2 mapping more difficult. Symmetry may not result in a more time-efficient sequence per se, however typically a scan may be performed with a shortest possible echo time for the first S+, which may result in a time-efficient sequence with very little "dead time".

As the time between the excitation pulse and the earliest one of the S+ echoes is equal to the time between the latest one of the S− echoes and the next excitation pulse, using these two echoes for T2 mapping may be facilitated.

Then, the time between the earliest one of the S+ echoes, F1, and the latest one of the S+ echoes, F2, is similar to the time between the earliest one of the S− echoes, P2, and the latest one of the S− echoes, P1. That means that the time between the excitation pulse and the latest one of the S+ echoes, F2, is similar to the time between the earliest one of the S− echoes, P2, and the subsequent excitation pulse. This again may be a prerequisite to be able to calculate a T2 map from the latest one of the S+ echoes, F2, and the latest one of the S− echoes, P1.

In an embodiment, wherein a time integral of gradients in a readout direction in the repetition time is dimensioned to provide that the gradients in the readout direction in the repetition time induce one cycle of dephasing per voxel. The term balanced is to be understood as a time integral of the field strength of the gradients having substantially a same but opposite magnitude.

In original SSFP everything is balanced. In the present sequence, there may be exactly 2 PI (one phase cycle) of phase change per voxel dimension. The first S+ and second S+ versus first S− and second S− phase relations are restored to exactly one cycle of dephasing due to the dephasing gradients being of the same polarity (each contributing half a cycle of dephasing).

The balance may allow multiple readouts of the same signal. Another effect may be that, in the present sequence of two S+ echoes and two S− echoes, the gradients separate S+ and S− signal such that one is dephased when the other is in phase.

Over the readout direction there is one cycle of dephasing per voxel (as may be necessary to induce and separate the S− echoes). This may prevent to spoil the signal.

In an embodiment, the method further comprises at least one of:
obtaining first water-fat decomposed signals based on a plurality of sampled first S+ echoes and a plurality of sampled second S+ echoes; and
obtaining second water-fat decomposed signals based on a plurality of sampled first S− echoes and a plurality of sampled second S− echoes.

The water-fat composed signals may be derived from the first and second S+ echo's. Two point Dixon reconstruction techniques may be applied. The water—fat composed signals may be derived from the first and second S− echo's. Likewise, two point Dixon reconstruction techniques may be applied. A B0 determination in the Dixon reconstruction can be shared between S+ and S−.

Alternatively, water-fat decomposition, T2 mapping and B0 determination may be obtained from all four echoes simultaneously using non-linear fitting of a signal model that includes these effects as parameter maps, which are optimized to provide adequate fit with the measured signal (e.g. with a least-squares measure). Such a signal model may also include the chemical-shift of fat signal, to allow the resulting parameter maps to be corrected for chemical-shift. Regularization may be included in the fitting procedure to improve the quality and stability of the fit taking into account noise and other signal imperfections.

In an embodiment, the first water-fat decomposed signals are obtained from the sampled first S+ echoes and second S+ echoes using Dixon reconstruction and the second water-fat decomposed signals are obtained from the sampled first S− echoes and second S− echoes using Dixon reconstruction.

Dixon reconstruction may provide a chemical shift imaging method using the in-phase/out-of-phase cycling of complex-valued fat and water signals. In this technique two sets of echo images may be acquired with slightly different echo times: the first with fat and water signals (close to) in phase at the centre of the echo and the second with the TE adjusted by a few milliseconds so that the fat and water signals are (close to) out-of-phase. The two images with different water-fat interference could be combined so that fat only and water only images may be created. The water-only image may hence be fat-suppressed. Dixon's idea can be explained very simply. Let IP represent the signal intensity of pixels from the in-phase image and let OP represent that from the out-of-phase image. By definition $$IP = W + F$$

$$OP = W - F$$

where W and F are the signal contributions from water and fat, respectively. By averaging sum and difference data from each point, "pure water" and "pure fat" images could be reconstructed.

In an embodiment, the method further comprises generating a first set of water, fat, in-phase and out-phase images based on the first water-fat decomposed signals, wherein the first water, fat, in-phase and out-phase images have a mixed contrast weighting which is predominantly T1w weighted and is low T2(*) weighted.

In an embodiment, the method further comprises generating a second set of Water(W), Fat(F), In Phase(IP), Out of Phase(OP) images based on the second water-fat decomposed signals, wherein the second set of water, fat, in-phase and out-phase images have an increased T2 weighting and diffusion weighting compared to the first set of water, fat, in-phase and out-phase images The information as derived from the second echo pair may be the same as the first set of echo pairs: Water(W), Fat(F), In Phase(IP), Out of Phase(OP), however with an increased T2 weighting, which may allow to calculate T2 maps.

In an embodiment, the method further comprises
determining effective echo times associated with the S+ echoes and the S− echoes from echo times associated with the S+ echoes and the S− echoes and the repetition time; and
generating, using the determined effective echo times, T2 maps associated with the individual S+ echo images and the individual S−echo images. The T2 maps may be calculated from an earliest one of the S+ echoes and a latest one of the S− echoes in the repetition time between subsequent excitation pulses and/or from a latest one of the S+ echoes and an earliest one of the S− echoes in the repetition time between subsequent excitation pulses. In the case of an MRI sequence using 2 S+ echoes and one S− echo (i.e. 3 echoes) in the repetition time between subsequent excitation pulses, as described in the present document, the T2 maps may be calculated from an earliest one of the S+ echoes and the S− echo in the repetition time between subsequent excitation pulses and/or from a latest one of the S+ echoes and the S− echo in the repetition time between subsequent excitation pulses (in fact, the earliest S− echo is the latest S− echo).

Sveinsson analytically (based on Extended Phase Graphs) describes the ratio of S+ and S− signal in terms of T2, T1, TE, TR, flip angle, and diffusion. TE/TR/flip angle are known from the sequence. A reference T1 of the tissue type is used. Diffusion can either be ignored or set to a reference value. This leaves a formula for S+/S− only dependent on T2, which can be rewritten to calculate T2 given S+/S−. A further explanation of the Sveinsson method may be found at https://www.sciencedirect.com/science/article/abs/pii/S0730725X1630265X a contents of which being incorporated herein by reference.

The calculation of accurate T2 maps may require images with different T2 weighting. The difference in T2 weighting between the S+ images and the S− images can be used for this T2 calculation. Specifically, the method further comprises calculating T2 maps using the first S+ echo and the last S− echo. Additionally, the method further comprises calculating T2 maps using the second S+ echo and the first S− echo.

The calculation of accurate T2 maps may require images with different T2 weighting, and preferably no off-resonance effects. Therefore, it may be beneficial to use Dixon reconstructed images for the mapping procedure. Furthermore, the Dixon reconstructed images may have increased signal-to-noise (SNR) compared to the individual F or P images, which may be beneficial for the T2 mapping process. When using Dixon reconstructed images for T2 mapping, the effective echo time of the Dixon reconstructed images of the FF set and of the PP set should be determined. This determination is based on a weighted average between the echo times of the first and second echo of each set. For example, this could be done by averaging the echo times of the first and second echo of each set. This would result in an effective echo time for the first set of water, fat, in-phase and out-of-phase images and a different effective echo time for the second set of water, fat, in-phase and out-of-phase images.

Specifically, the method further comprises calculating T2 maps using the effective echo times, which are defined for the individual S+ and S− echoes as follows:

Individual S+echoes: $TE_{effective}=TE$

Individual S−echoes: $T_{Eeffective}=TR+TE$

Here, TE is the echo time of the respective echo, and TR is the repetition time, which equals the time between succeeding excitation pulses.

Accordingly, in an embodiment, the method further comprises calculating individual effective echo times of the individual S+ and S− echoes, and calculating generic T2 maps using the individual effective echo times of the S+ and S− images.

The method further comprises calculating T2 maps of the water, fat, in-phase and out-of-phase images using the effective echo times for the Dixon reconstructed images, which are defined as follows:

For both the first and second set of Dixon reconstructed images, the effective echo times are defined as a weighted average of the individual echo times of the four echoes, where x is a weighting factor, and $TE_n$ are the echo times of the individual echoes as defined elsewhere in the present document:

S+ Dixon reconstructions: $T_{Eeffective}=x \cdot TE_1+(1-x) \cdot TE_2$

S− Dixon reconstructions: $TE_{effective}=TR+x \cdot TE_3+(1-x) \cdot TE_4$

Accordingly, in an embodiment, the method further comprises calculating effective echo times for the first set of water, fat, in-phase and out-phase images and for the second set of water, fat, in-phase and out-phase images, and
calculating T2 maps of the water, fat, in-phase and out-of-phase images using the effective echo times for the first set of water, fat, in-phase and out-phase images and the second set of water, fat, in-phase and out-phase images.

In an embodiment, the method further comprising generating images with intermediate contrast weightings based on combining an image generated from a single one of the echo's with at least one of the generated contrast images.

An image generated from a single one of the echo's may provide a certain contrast image. By combining the such a contrast image with one with different contrast, an image with intermediate contrast may be generated. For example, by combining S− images with S+ images, the hyperintense signal in the S− image related to the increased T2 weighting, can be added to the S+ image with intrinsically lower T2 weighting.

In an embodiment, the method further comprises:
providing the sampled first S+ echo, the sampled second S+ echo, the sampled first S− echo, and the sampled second S− echo to a statistical model;
generating by the statistical model a synthetic CT image of the object based on the provided the sampled first S+ echo, the sampled second S+ echo, the sampled first S− echo, and the sampled second S− echo.

Using the statistical model, a synthetic Computer Tomography, CT, image may be generated using the generated MRI data, i.e. the data sampled at the first and second S+ echo's and at the first and second S− echo's. The model may derive the synthetic CT image from the sampled data, i.e. the k-space data, or from images derived from the sampled data. Any synthetic CT model may be applied. The data as acquired may comprise many aspects that may assist to generate a machine learning model that translates MRI data into CT-like contrasts. In CT four components are important for the determination of the attenuation values. More specifically, fat, water, marrow with its specific mix of bone mineral density, fat and water, and the dense cortical bone determine the CT values. The presently described MRI imaging method provides information of these tissues, and therefore it may be used for generating a machine learning model for CT image synthesis from MRI data, enabling accurate Hounsfield unit estimation.

Specifically, the statistical model may comprise a machine learning algorithm, wherein the machine learning algorithm is pre-trained using at least one of:
- provided S+ data and associated CT images,
- provided S− data and associated CT images,
- provided S+ data, associated S− data and associated CT images,
- provided S+ data and/or associated S− data and/or a contrast image from the group of contrast images, and
- any other MRI data and associated CT images Many synthetic CT algorithms use T1w gradient echo data similar to our S+ data. Furthermore, many synthetic CT algorithms use a combination from In Phase, IP, Water, W, Fat, F, and Out of Phase, OP, as input data. The present method may provide such data. Moreover, the present sequences may generate T1/T2w and dedicated T2w contrasts, which provide unique complementary information highly favorable for training of a sCT generation machine learning (ML) method. Furthermore, the ML method may also be fed with other contrast images next to the T1/T2w and T2w, including the W,F,IP,OP, which would provide even more dedicated data. The fact that the data is intrinsically registered due to the fact that it is obtained from a single experiment may be another advantage. The machine learning algorithm may have been pre-trained using conventional MRI data and associated CT images.

More specifically, the machine learning algorithm may comprise a neural network, including a convolutional neural network, attention-aware networks, generative adversarial networks and/or graph convolutional networks.

According to an aspect of the invention, there is provided a method for generating a contrast image using MRI comprising a three-echo steady state free precession, SSFP, sequence, the method comprising:
- generating a pulse train of excitation pulses having a repetition time;
- generating between two subsequent excitation pulses of the pulse train a first S+ echo; a second S+ echo and a first S− echo;
- sampling between the two subsequent excitation pulses the first S+ echo; the second S+ echo and the first S− echo;
- generating the contrast image based on the sampled first S+ echo, the sampled second S+ echo and the sampled first S− echo.

In an embodiment, between the two subsequent excitation pulses,
- a readout gradient of the first S+ echo and a readout gradient of the second S+ echo have an opposite polarity, whereby a time integral of the readout gradient of the first S+ echo and a time integral of the readout gradient of the second S+ echo have a same absolute value,
- the readout gradient of a latest of the first and second S+ echo's and the readout gradient of the first S− echo have a same polarity and a same value of the time integral,
- a dephasing gradient in a readout direction is provided before an earliest of the first and second S+ echo's,
- a rephasing gradient in the readout direction is provided between the latest of the first and second S+ echo's and the S− echo, and
- a rephasing gradient in the readout direction is provided after the S− echo, wherein a time integral of the readout gradients, the dephasing gradient and the rephasing gradients over the repetition time provides for one cycle of dephasing per voxel.

With the 3 echo variant of the method, the same of similar effects may be achieved as with the 4 echo variant of the method. Likewise, the same of similar embodiments may be provided as with the 4 echo variant of the method in accordance with the invention.

In an embodiment, the contrast image comprises any contrast image from a group of contrast images comprising:
- a water-fat decomposed image,
- a quantitative relaxometry map,
- a phase based map, and
- a synthetic CT reconstruction.

Any contrast image from the following group of contrast images may be derived from the three echo variant of the magnetic resonance imaging sequence:
- a T1w image,
- a T2w image,
- a mixed T1/T2w image,
- a water fraction image,
- a fat fraction image,
- an in-phase image,
- an opposed-phase image, and
- a T2map general.

According to an further aspect of the invention, there is provided a control device for controlling a magnetic resonance imaging apparatus, the control device configured to control the magnetic resonance imaging apparatus to:
- generate a pulse train of excitation pulses having a repetition time;
- generate between two subsequent excitation pulses of the pulse train a first S+ echo; a second S+ echo; a first S− echo; and a second S− echo;
- sample between the two subsequent excitation pulses the first S+ echo; the second S+ echo; the first S− echo; and the second S− echo; and
- generate the contrast image based on the sampled first S+ echo, the sampled second S+ echo, the sampled first S− echo, and the sampled second S− echo.

According to an further aspect of the invention, there is provided a control device for controlling a magnetic resonance imaging apparatus, the control device configured to control the magnetic resonance imaging apparatus to:
- generate a pulse train of excitation pulses having a repetition time;
- generate between two subsequent excitation pulses of the pulse train a first S+ echo; a second S+ echo and a first S− echo;
- sample between the two subsequent excitation pulses the first S+ echo; the second S+ echo and the first S− echo; and
- generate the contrast image based on the sampled first S+ echo, the sampled second S+ echo and the sampled first S− echo.

According to a still further aspect of the invention, there is provided an assembly of a magnetic resonance imaging apparatus and the control device for controlling the magnetic resonance imaging apparatus as described above.

According to a yet further aspect of the invention, there is provided a software program comprising program instructions for, when run on a data processing device of a magnetic imaging apparatus, provide the magnetic imaging apparatus to perform any one of the methods according to the invention.

With the control device, the assembly and the software, the same or similar effects may be achieved as with the methods described in the present document. Also, the same or similar preferred embodiments may be provided as with the methods described in the present document, providing the same or similar effects.

BRIEF DESCRIPTIONS OF THE DRAWINGS

Figure 5:
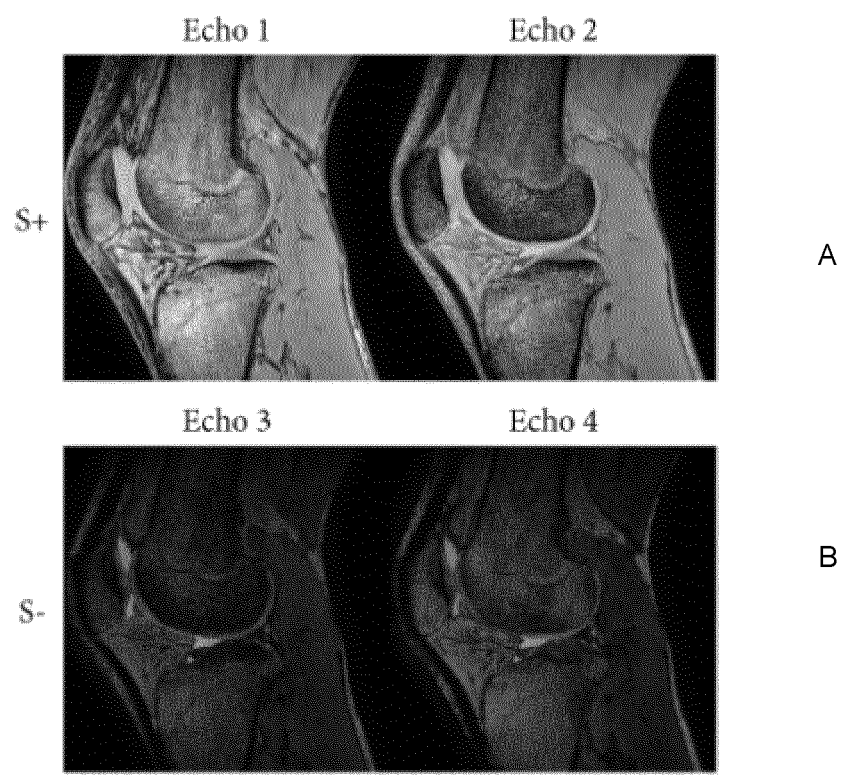
Figure 6:
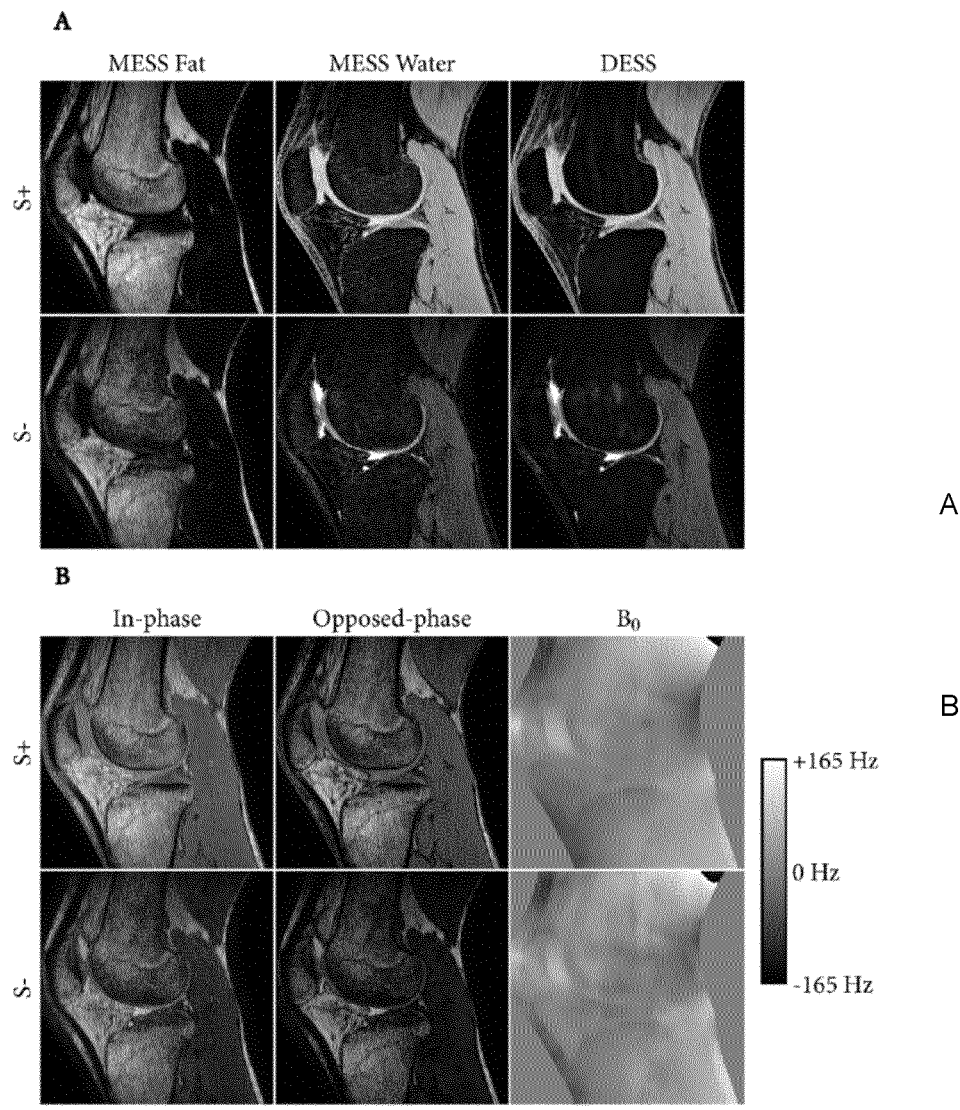
Figure 8:
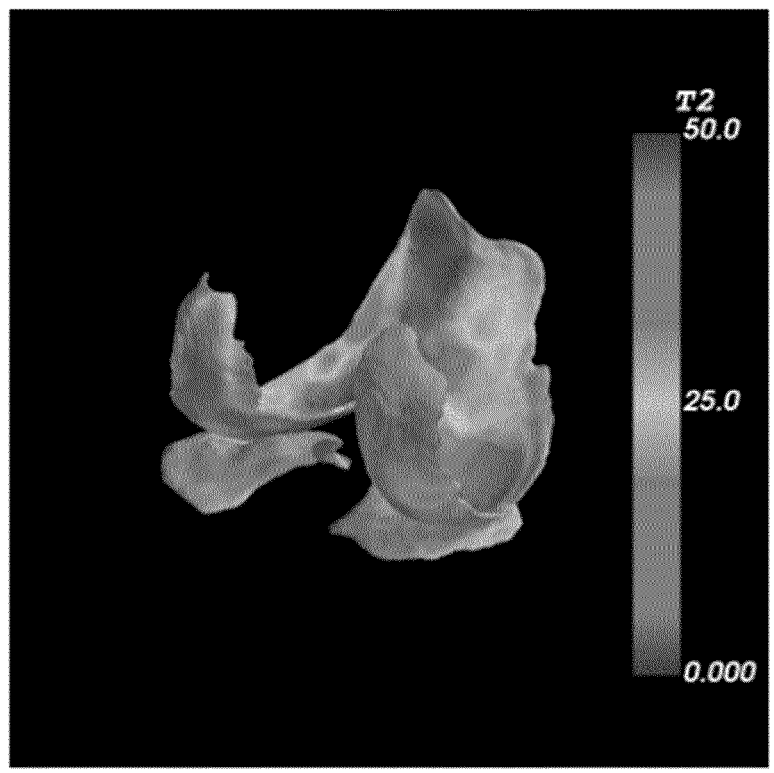
Figure 9:
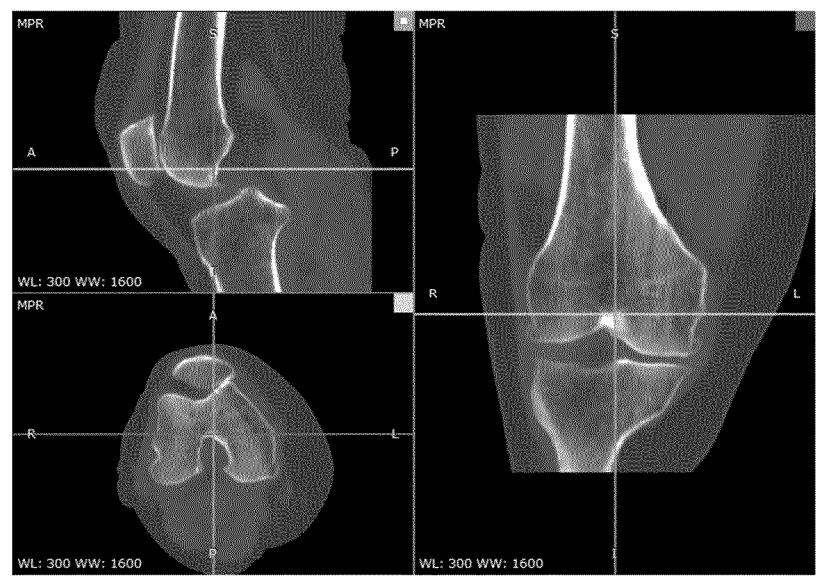
Figure 10:
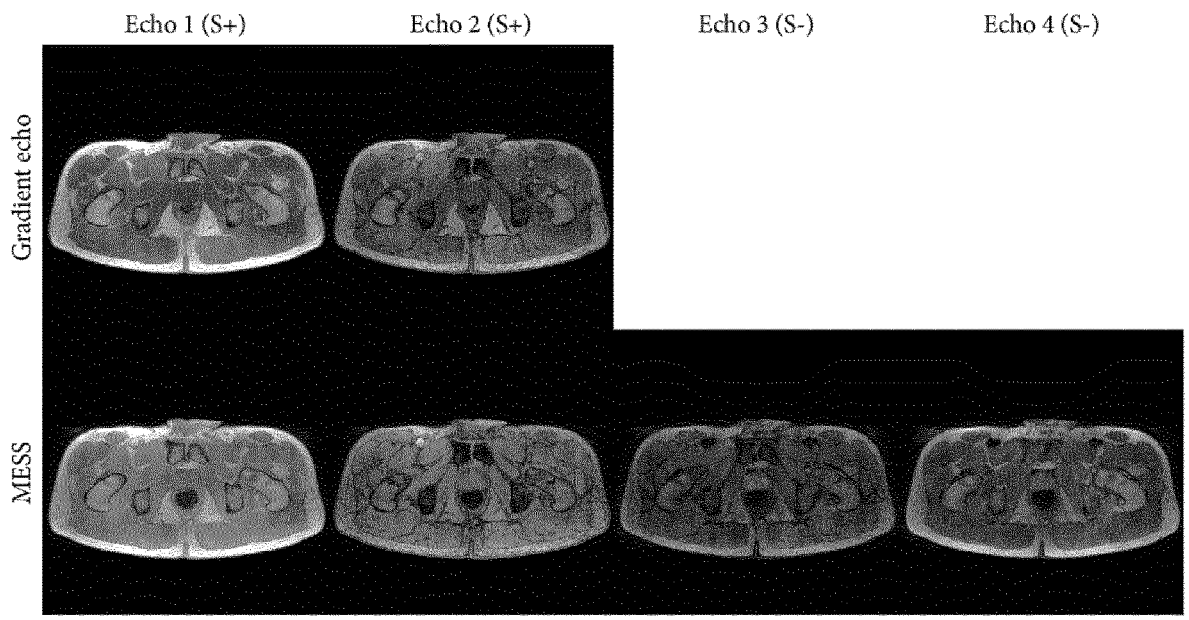
Figure 11:
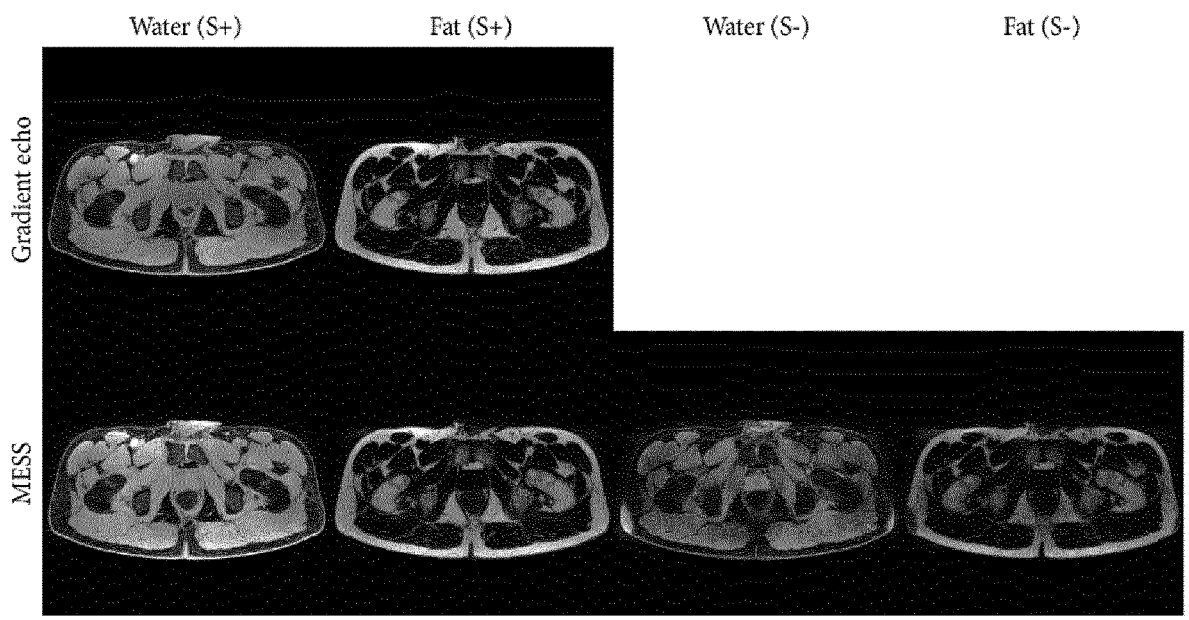
Figure 12:
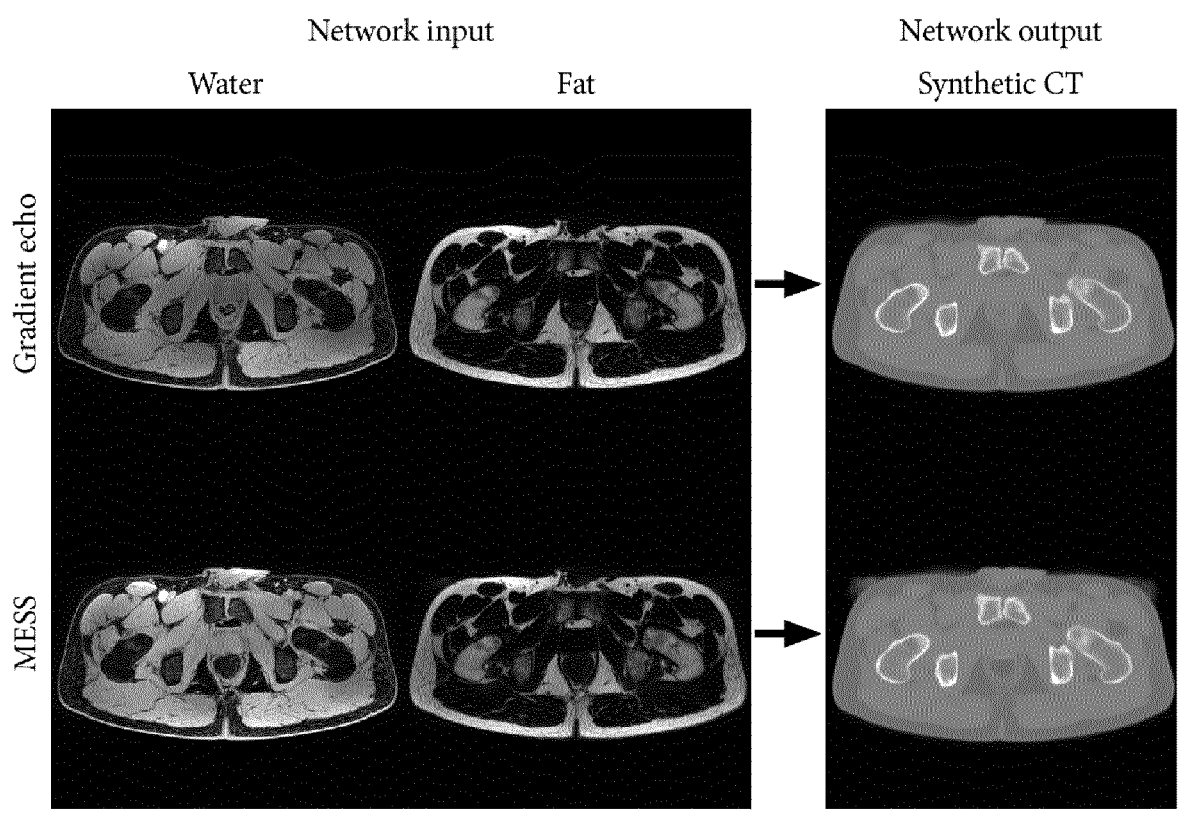

FIGS. 5A and B depict S+ and S− images derived from 4 echo's obtained from an exemplary MESS MRI sequence;

FIGS. 6A and 6B depict exemplary water, fat, in-phase, opposed phase and B0 images derived from DESS and MESS MRI sequences;

FIGS. 7A and 7B depict exemplary T2 maps of water derived from DESS and of water and fat derived from MESS MRI sequences and region specific T2 values of cartilage in the knee;

FIG. 8 depicts a cartilage segmentation of a knee;

FIG. 9 depicts a deep learning-based synthetic CT image of a knee obtained using a CNN model trained on MESS data;

FIG. 10 depicts S+ and S− images of the pelvis derived from 2 echo GRE and 4 echo MESS obtained from an exemplary MRI sequence;

FIG. 11 depicts water and fat images of the pelvis derived from 2 echo GRE and 4 echo MESS obtained from an exemplary MRI sequence; and FIG. 12 depicts water, fat and resulting synthetic CT images of the pelvis derived from GRE and MESS data using a deep learning model trained on GRE data.

DETAILED DESCRIPTION OF EMBODIMENTS

Figure 1:
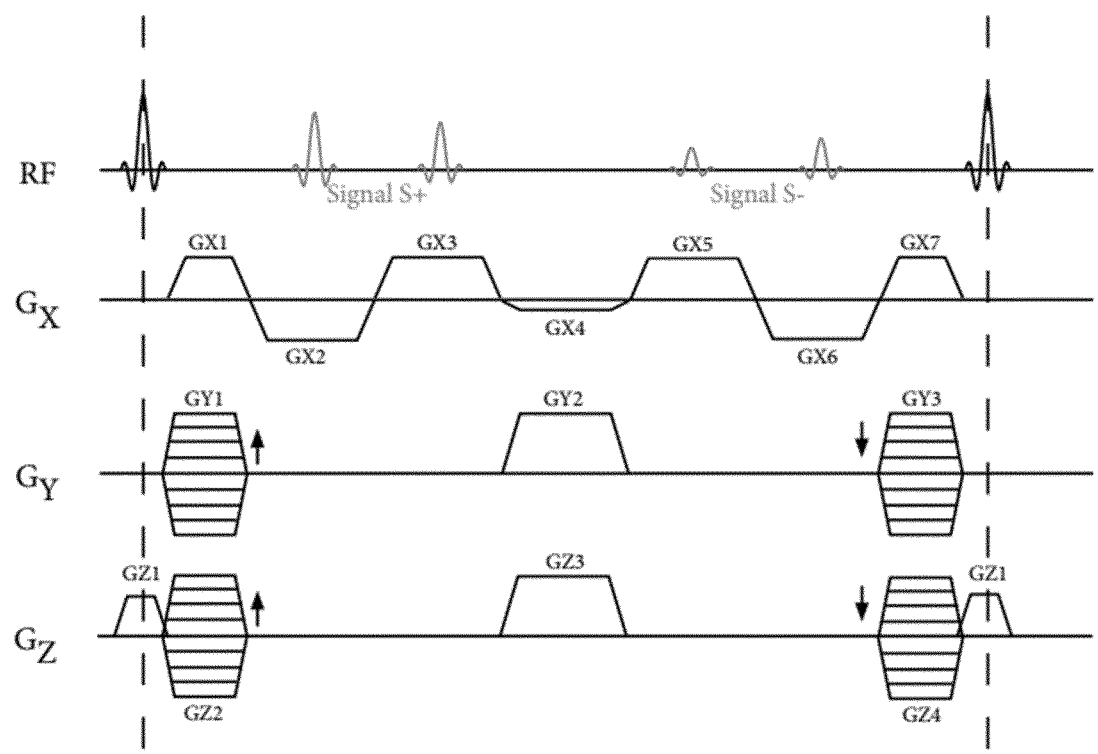
FIG. 1 depicts a time diagram of a 3 dimensional 4 echo MRI sequence.

FIG. 1 depicts a time diagram illustrating a repetition time Tr of a pulse sequence. The sequence as depicted and described, may be repeated periodically, using the repetition time as a repetition time period.

A 3D (i.e. 3 Dimensional) pulse sequence is described below.

1. The object to be examined is excited with a radio frequency, RF, pulse, during which an optional gradient in the slice direction (GZ1) selects the slice/slab to be excited
2. A dephaser gradient in the readout direction (GX1) and phase encoding gradients in the Y/Z directions (GY1/GZ2) are turned on. GX1 dephases the FID signal, and GY1/GZ1 encode information on the Y/Z coordinates in the phase of the signal.
   a. The area of the GX1 gradient is half the area of GX2, and GX1 has opposite polarity to GX2.
3. The readout gradient for the first S+ echo (GX2) is turned on to acquire echo 1 at echo time $TE_1$ (also referred to as the first S+ echo time). GX2 refocuses the FID signal into a gradient echo.
4. The readout gradient for the second S+ echo (GX3) is turned on to acquire echo 2 at echo time $TE_2$ (also referred to as the second S+ echo time).
   a. GX3 has opposite polarity to GX2, and GX3 has the same area as GX2.

Regarding. 3. and 4. It is noted that a same polarity for readout may be applied using flyback gradients. This may take more time. If time is not an issue, then this may be an option as chemical shift effect may then all be in the same direction, as chemical shift effects relate to the readout gradient.

5. A small rephasing gradient in the readout direction (GX4) is turned on. GX4 compensates the trailing ramp of the GX3 gradient and leading ramp of the GX5 gradient. This is to ensure exactly one cycle of dephasing per voxel at the end of the repetition of the pulse sequence.

Simultaneously, optional spoiler gradients in the Y/Z directions (GY2/GZ3) can be turned on. These spoilers prevent S+ signal from "leaking" into the S− signal and vice versa.
   a. In the middle of GX4 S+ signal is dephased by half a cycle per voxel. At the same time, S− signal, originating from the previous repetition of the pulse sequence is now also dephased by half a cycle per voxel, but in the opposite direction.
6. The readout gradient for the first S− echo (GX5) is turned on to acquire echo 3 at echo time $TE_3$ (also referred to as the first S− echo time).
   a. GX5 has the same area and polarity as GX3.
   b. GX5 further dephases the S+ signal, while it refocuses the S− signal into a "spin-echo-like" echo.
7. The readout gradient for the second S− echo (GX6) is turned on to acquire echo 4 at echo time $TE_4$ (also referred to as the second S− echo time).
   a. GX6 has opposite polarity to GX5, and GX6 has the same area as GX5.
8. A refocusing gradient in the readout direction (GX7) is turned on. Simultaneously refocusing gradients for the phase encoding in the Y/Z directions (GY3, GZ4) are turned on.
   a. The total dephasing caused by all readout gradients (GX1-7) is now exactly one cycle of dephasing per voxel.
   b. GY3 and GZ4 apply gradients with the same area as GY1 and GZ2, but with opposite polarity, to rewind the dephasing caused by GY1 and GZ2.
9. Steps 1-8 are repeated for all values of the phase encoding gradients (GY1/GZ2).
   a. The time period between each RF excitation is referred to as the repetition time (TR).

GX1 and GX7 are dephaser respectively rephaser gradients, while GX2, GX3, GX5 and GX6 are readout gradients. An area of each one of GX1 and GX7 may be half an area of each one of GX2, GX3, GX5 and GX6.

The 3D configuration as described with reference to FIG. 1, rephasing gradients may compensate slice/slab selection gradients. Alternatively, an area of the PE gradients (GZ2, GZ4) may be chosen to take account of the slice/slab selection gradients.

Figure 2:
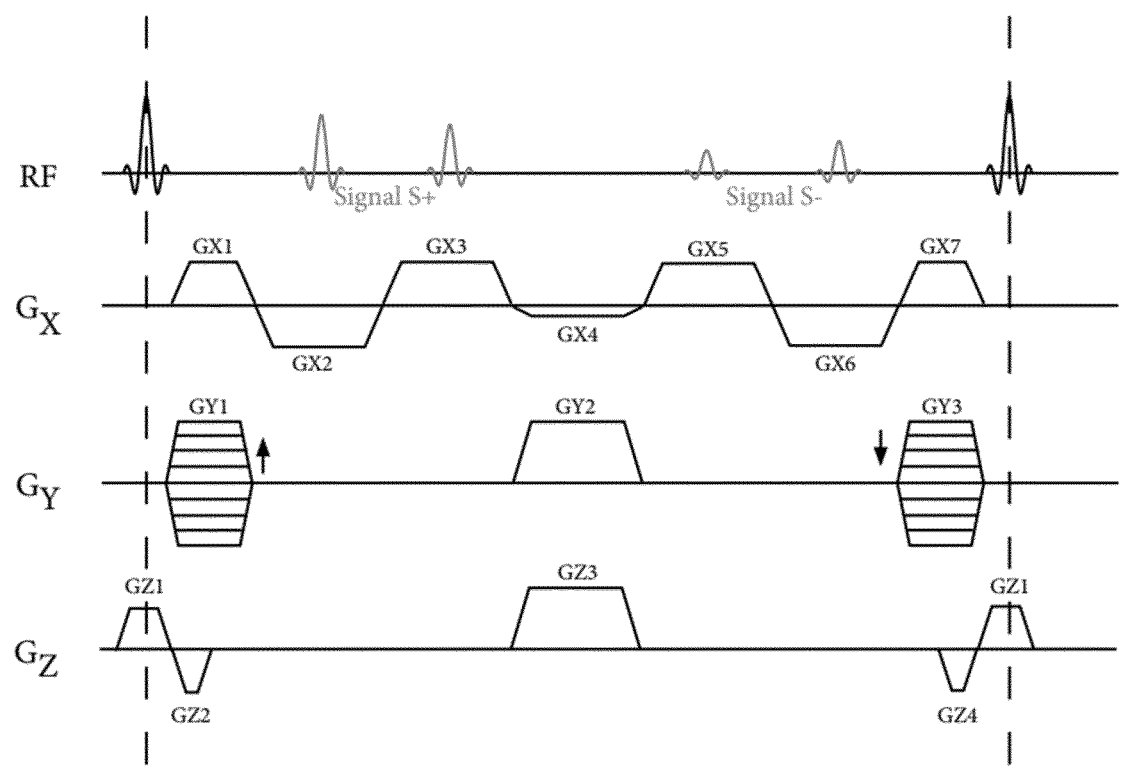
FIG. 2 depicts a time diagram of a 2 dimensional 4 echo MRI sequence.

FIG. 2 depicts a time diagram, similar to the time diagram as depicted in FIG. 1, whereby the MRI sequence is applied in 2 dimensions instead of in 3 dimensions. The description to FIG. 1 is therefore likewise applicable to FIG. 2, mutatis mutandis. In 2D, the rephaser gradients GZ2 and GZ4 may each have half an area of gradient GZ1.

It is noted that GX1 and GX7 are shorter as they have another function as compared to GX2-6. GX1 en GX7 are dephaser and rephaser gradients, with an area of a half of that of GX2 (and similarly GX3/GX5/GX6). GX2/GX3/GX5/GX6 are readout gradients, whereby an echo may be detected.

Figure 3:
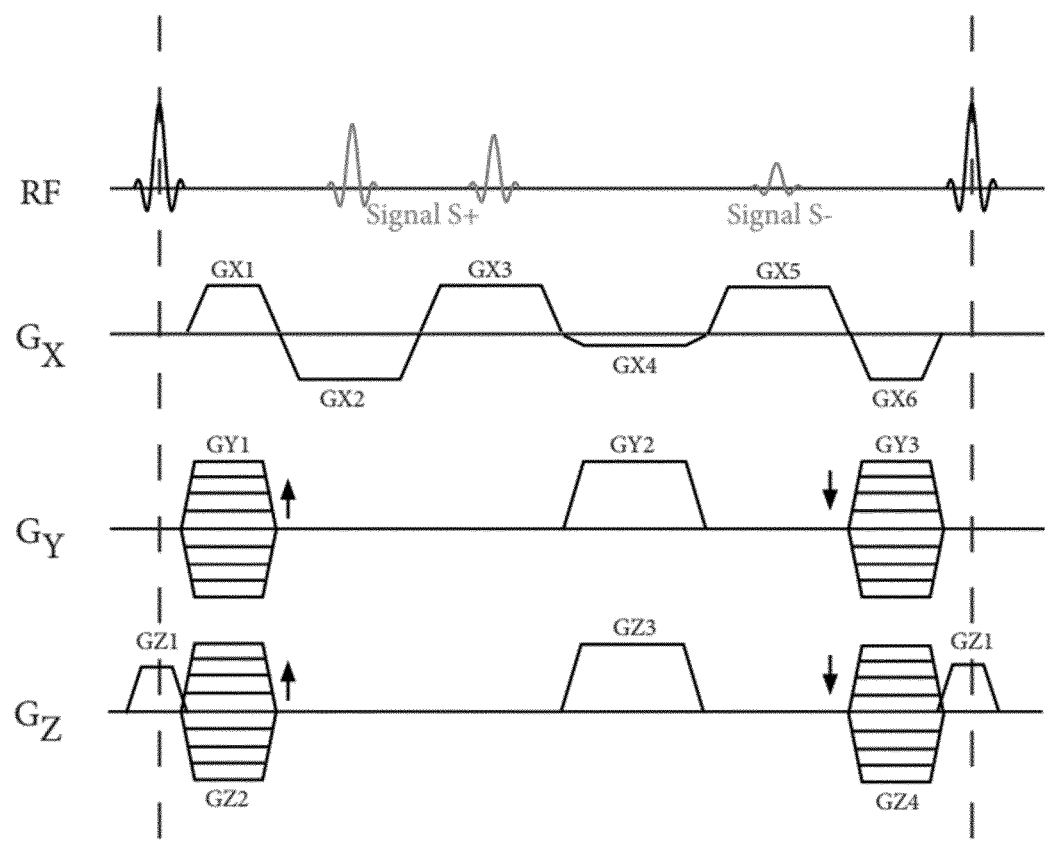
FIG. 3 depicts a time diagram of a 3 dimensional 3 echo MRI sequence.

FIG. 3 depicts another version of the MRI sequence, namely comprising two S+ echoes and one S− echo.

A 3D (i.e. 3 Dimensional) pulse sequence is described below.

1. The object to be examined is excited with a radio frequency, RF, pulse, during which an optional gradient in the slice direction (GZ1) selects the slice/slab to be excited
2. A dephaser gradient in the readout direction (GX1) and phase encoding gradients in the Y/Z directions (GY1/GZ2) are turned on. GX1 dephases the FID signal, and GY1/GZ1 encode information on the Y/Z coordinates in the phase of the signal.
   a. The area of the GX1 gradient is half the area of GX2, and GX1 has opposite polarity to GX2.
3. The readout gradient for the first S+ echo (GX2) is turned on to acquire echo 1 at echo time $TE_1$ (also referred to as the first S+ echo time). GX2 refocuses the FID signal into a gradient echo.
4. The readout gradient for the second S+ echo (GX3) is turned on to acquire echo 2 at echo time $TE_2$ (also referred to as the second S+ echo time).
   a. GX3 has opposite polarity to GX2, and GX3 has the same area as GX2.
5. A small rephasing gradient in the readout direction (GX4) is turned on. GX4 compensates the trailing ramp of the GX3 gradient and leading ramp of the GX5 gradient.

This is to ensure exactly one cycle of dephasing per voxel at the end of the repetition of the pulse sequence.

Simultaneously, optional spoiler gradients in the Y/Z directions (GY2/GZ3) can be turned on. These spoilers prevent S+ signal from "leaking" into the S− signal and vice versa.
   a. In the middle of GX4 is S+ signal is dephased by half a cycle per voxel. At the same time, S− signal, originating from the previous repetition of the pulse sequence is now also dephased by half a cycle per voxel, but in the opposite direction.
6. The readout gradient for the first S− echo (GX5) is turned on to acquire echo 3 at echo time $TE_3$ (also referred to as the first S− echo time).
   a. GX5 has the same area and polarity as GX3.
   b. GX5 further dephases the S+ signal, while it refocuses the S− signal into a "spin-echo-like" echo.
8. A refocusing gradient in the readout direction (GX6) is turned on. Simultaneously refocusing gradients for the phase encoding in the Y/Z directions (GY3, GZ4) are turned on.
   a. The total dephasing caused by all readout gradients (GX1-6) is now exactly one cycle of dephasing per voxel.
   b. GY3 and GZ4 apply gradients with the same area as GY1 and GZ2, but with opposite polarity, to rewind the dephasing caused by GY1 and GZ2.
9. Steps 1-8 are repeated for all values of the phase encoding gradients (GY1/GZ2).
   a. The time period between each RF excitation is referred to as the repetition time (TR).

GX1 and GX6 are dephaser respectively rephaser gradients, while GX2, GX3, and GX5 are readout gradients. An area of each one of GX1 and GX6 may be half an area of each one of GX2, GX3, and GX5.

Figure 4:
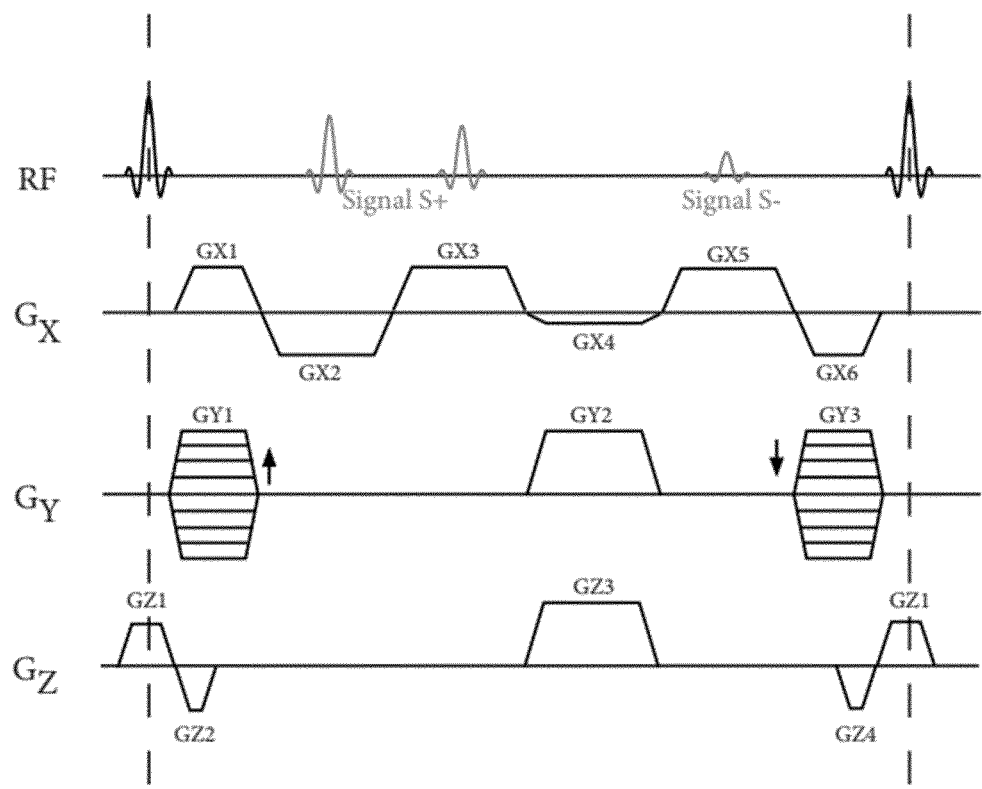
FIG. 4 depicts a time diagram of a 2 dimensional 3 echo MRI sequence.

FIG. 4 depicts a time diagram, similar to the time diagram as depicted in FIG. 3, whereby the 3 echo MRI sequence is applied in 2 dimensions instead of in 3 dimensions. The description to FIG. 3 is therefore likewise applicable to FIG. 4, mutatis mutandis. In 2D, the rephaser gradients GZ2 and GZ4 may each have half an area of gradient GZ1.

The present development may further be described as follows:

Method for generating MRI data of an object, the method comprising the steps of:
a) generating a radiofrequency pulse to excite the object;
b) generating a gradient GZ1 in a slice direction to select a slice/slab to be excited;
c) generating a dephaser gradient GX1 in a readout direction, wherein GX1 dephases a FID signal associated with the excited object;
d) generating a phase encoding gradient GY1 in a Y direction, wherein
   the Y direction is not parallel to the readout direction, and
   the phase encoding gradient GY1 encodes information on the Y coordinates in the phase of the signal;
e) generating a phase encoding gradient GZ2 in a Z direction, wherein
   the Z direction is not parallel to the readout direction and is not parallel to the Y direction, and
   the phase encoding gradient GZ2 encodes information on the Z coordinate in the phase of the signal;
f) generating a readout gradient GX2 in the readout direction, wherein an area of the readout gradient GX2 is twice an area of the dephaser gradient GX1,
   a polarity of the readout gradient GX2 is opposite to a polarity the dephaser gradient GX1, and
   the readout gradient GX2 refocuses the FID signal into a gradient echo;
g) acquiring a first S+ echo based on the generated readout gradient GX2;
h) generating a readout gradient GX3 in the readout direction, wherein
   an area of the readout gradient GX3 is the same as the area of the readout gradient GX2, and
   a polarity of the readout gradient GX3 is opposite to the polarity of the readout gradient GX2;
i) acquiring a second S+ echo based on the generated readout gradient GX3;
j) generating a rephrasing gradient GX4 in the readout direction;
k) generating a readout gradient GX5 in the readout direction, wherein
   an area of the readout gradient GX5 is the same as the area of the readout gradient GX3, and
   a polarity of the readout gradient GX5 is the same as the polarity of the readout gradient GX3;
   the readout gradient GX5 further dephases the first S+ echo; and
   the readout gradient GX5 refocuses a S− signal into a spin-like echo;
l) acquiring a second S− echo based on the generated readout gradient GX5;
m) generating a readout gradient GX5 in the readout direction, wherein
   an area of the readout gradient GX6 is the same as the area of the readout gradient GX5;

a polarity of the readout gradient GX6 is opposite to the polarity the readout gradient GX5;

n) acquiring a first S− echo based on the generated readout gradient GXG;

o) generating a refocusing gradient GX7 in the readout direction p) generating a refocusing gradient GY3 in the Y direction, wherein
the refocusing gradient GY3 encodes the phase in the Y direction;
an area of the refocusing gradient GY3 is the same as the area of the phase encoding gradient GY1, and
a polarity of the refocusing gradient GY3 is opposite to the polarity of the phase encoding gradient GY1;

q) generating a refocusing gradient GZ4 in the Z direction, wherein
the refocusing gradient GZ4 encodes the phase in the Z direction
an area of the refocusing gradient GZ4 is the same as the area of the phase encoding gradient GY1, and
a polarity of the refocusing gradient GZ4 is opposite to the polarity of the phase encoding gradient GY1.

Method for generating MRI data as described in any of the above, further comprising the step of:

r) generating a spoiler gradient GY3 in the Y direction.

Method for generating MRI data as described in any of the above, further comprising the step of:

s) generating a spoiler gradient GZ4 in the Z direction.

Method for generating MRI data as described in any of the above, wherein
t) the area of the gradient GZ2 is half of the area of the gradient GZ1, and
u) the area of the gradient GZ4 is half of the area of the gradient GZ1.

Method for generating MRI data as described in any of the above, wherein
v) the area of the gradient GZ2 is equal to the area of the gradient GZ1, and
w) the area of the gradient GZ4 is equal to the area of the gradient GZ1.

Method for generating MRI data as described in any of the above, wherein the radio frequency pulse is a slice and/or slab selective pulse.

As an example, a description of a development of an efficient, 5-minute multi-parametric MRI sequence for imaging of the knee.

A summary of the development is provided in the following paragraphs.

The multiple-echo steady-state (MESS) sequence is a multi-echo extension of the double-echo steady-state (DESS) sequence. Both readouts of a 5-minute DESS sequence were replaced by two, faster bipolar readouts, maintaining equal total acquisition time. The multiple echoes enabled both water-fat separation and $T_2$ quantification. The MESS water images were compared to water-selective DESS images for 5 subjects, both qualitatively and quantitatively using cartilage $T_2$ and thickness quantification derived from cartilage segmentations.

The MESS images enabled robust water-fat separation and showed good correspondence to the DESS images.

MESS also provided high quality images with various contrasts that were not available in DESS and showed capability of multiplanar reformatting. The mean cartilage $T_2$ and thickness quantification for 5 subjects showed a deviation between DESS and MESS that was less than 5%.

The 5-minute MESS sequence offers a viable alternative to a water-selective DESS sequence, providing comparable water images and $T_2$ quantification, as well as $T_1$- and $T_2$-weighted non-fat-suppressed images and Dixon reconstructions and field maps.

Following the above summary, a more detailed description follows in the below.

The rising demand for MRI examinations and associated increase in costs and waiting times has driven efforts in the MR community to demonstrate the value of MRI and to raise the cost-effectiveness of MRI. Among the many ways to achieve this, there have been efforts to replace standard MRI protocols with protocols that contain shorter and/or fewer scans that provide similar diagnostic information.

For MRI of the knee, two studies have shown that 5 minute protocols can replace conventional protocols. Alaia et al have shown that a variety of scans from a standard knee protocol can be accelerated to reduce the time of the examination from approximately 12 minutes to 5 minutes while maintaining similar diagnostic accuracy. Reference is made to Alaia E F, Benedick A, Obuchowski N A, et al. Comparison of a fast 5-min knee MRI protocol with a standard knee MRI protocol: a multi-institutional multi-reader study. Skeletal Radiol. 2018; 47:107-116 doi: 10.1007/s00256-017-2780-9. Chaudhari et al proposed and evaluated the use of a single 5-minute double-echo steady-state (DESS) sequence as an alternative to a 15 minute conventional clinical knee examination consisting of multiple scans with varying $T_1$ and $T_2$ weighting, both with and without fat-suppression. They reported that the 5-minute DESS sequence depicts knee abnormalities similarly to the longer clinical protocol, and that pairing the DESS sequence with a 2-minute proton-density fat-saturated scan could be a potential candidate for an abbreviated knee examination protocol. Reference is made to Chaudhari A S, Stevens K J, Sveinsson B, et al. Combined 5-minute double-echo in steady-state with separated echoes and 2-minute proton-density-weighted 2D FSE sequence for comprehensive whole-joint knee MRI assessment. J. Magn. Reson. Imaging 2019; 49:e183-e194 doi: 10.1002/jmri.26582.

The time-saving of such abbreviated protocols directly translates to an improvement in cost-effectiveness and reduction of patient burden. Furthermore, a single, shorter acquisition is less susceptible to intra-scan motion than conventional protocols, and all information derived from the acquisition will be intrinsically registered.

Interestingly, the proposed 5-minute DESS protocol is water-selective and therefore does not provide a fat signal. Although many pathologies are visible in fat-suppressed images, images without fat-suppression also contain valuable information, for example for pathology of the bone marrow, osteoporosis, and degeneration of the muscle. Furthermore, by not suppressing fat signal, all morphological information is preserved, for example distinguishing bone marrow from cortical bone, which can support morphological analysis, such as segmentation of structures in the knee and synthetic CT generation.

In this study, the multiple-echo steady-state (MESS) sequence is proposed, a multi-echo extension of the DESS sequence. By including more echoes in the acquisition, Dixon water-fat separation can be used instead of water-selective excitation, and therefore MESS preserves signal from fat, whereas DESS does not. By preserving this signal, MESS can provide both conventional $T_1$-weighted images and $T_2$-enhanced images, as well as the images reconstructed from the Dixon water-fat separation, such as water and fat fraction maps, reconstructed in-phase and opposed-phase images, and information on main magnetic field inhomogeneity. A further advantage of Dixon water-fat separation is that it has been reported to be more robust than fat suppression techniques in the presence of inhomogeneity of the main magnetic field.

A number of multi-echo variations of the DESS sequence have been previously proposed. For example, the Triple Echo Steady-State sequence measures an additional echo to also estimate $T_1$ and reduce sensitivity to $B_1$ inhomogeneity. Cheng at al proposed the use of multiple echoes to also estimate $T_2^*$ and field map information. Reference is made to Cheng C-C, Mei C-S, Duryea J, et al. Dual-pathway multi-echo sequence for simultaneous frequency and T 2 mapping. J. Magn. Reson. 2016; 265:177-187 doi: 10.1016/j.jmr.2016.01.019. Chaudhari et al combined ultra-short echo-time DESS acquisition with repeated acquisition with echo-time shifts to perform water-fat separation. Reference is made to Chaudhari A S, Sveinsson B, Moran C J, et al. Imaging and T2 relaxometry of short-T2 connective tissues in the knee using ultrashort echo-time double-echo steady-state (UTEDESS). Magn. Reson. Med. 2017; 78:2136-2148 doi: 10.1002/mrm.26577. A difference of the multi-echo approach is taken in MESS is that it provides water-fat separation without requiring additional scan time. This is possible because the repetition time in DESS is typically relatively long to ensure sufficient $T_2$ contrast. Within the same repetition time, MESS acquires multiple echoes with higher readout bandwidth, which efficiently increases the information gathered and enables Dixon water-fat separation without increasing the total acquisition time.

In this study, a 5-minute MESS sequence is compared to a 5-minute water-selective DESS acquisition in the knee at 3 tesla. The scan parameters were matched to investigate the influence of Dixon water-fat separation on image quality and on quantification of $T_2$ and thickness of the articular cartilage.

The DESS sequence is a steady-state free-precession (SSFP) acquisition that samples two echoes. The first echo measures a FID-like signal, referred to as S+, which resembles the signal from a $T_1$-weighted gradient echo acquisition. The second echo measures a spin echo-like signal, referred to as S−, which has a longer effective echo time and therefore has additional $T_2$ weighting. A DESS acquisition typically uses a low readout bandwidth to achieve maximal SNR with a relatively long repetition time. This means there is ample opportunity to modify the acquisition, while maintaining the overall low and high $T_2$ weighting of the individual echoes.

The MESS sequence is an extension of the DESS sequence where each readout is replaced by two or more readouts with alternating readout polarity, similar to how a single echo gradient echo sequence extends to a multi-echo sequence. MESS uses a higher readout bandwidth in order to acquire these additional echoes in the same scan time. Similar to DESS, the two middle echoes have the same readout polarity, resulting in a total of one cycle of dephasing per voxel in the readout dimension at the end of each repetition, which allows the S− signal to be recalled in the next repetition of the pulse sequence. The echo times have been chosen such that 2-point Dixon water-fat separation can be reliably used (12). FIG. 1 shows the extension from DESS to MESS for a 4-echo MESS sequence. A baseline acquisition of the present development is a 5-minute DESS sequence with a resolution of 0.5×0.5×1.3 mm (reconstructed to 0.5×0.5×0.65) and a field of view of 144×144× 130 mm. Other scan parameters included: $TE_1/TE_2/TR$ 4.9/14.3/19.2 ms, flip angle 20°, 1.2×1.2 SENSE, bandwidth 228 Hz/pixel, scan duration 304 seconds. This acquisition used water excitation with a 1-2-1 binomial RF pulse. The parameters of the 4-echo MESS acquisition were matched to the DESS acquisition, except for the following: $TE_1/TE_2/TE_3/TE_4/TR$ 3.5/6.5/12.6/15.6/19.1 ms, bandwidth 362 Hz/pixel, scan duration 303 seconds. All acquisitions were acquired at a field strength of 3 tesla (Philips Ingenia, Best, The Netherlands).

DESS and MESS images of the knees of 5 healthy volunteers (mean age 31 years, 4 male, 1 female) have been acquired, in accordance with institutional guidelines and with approval of the medical ethics committee of the University Medical Center Utrecht. Water-fat separation was performed using the MESS images, and $T_2$ mapping was applied to both DESS and MESS images.

When appropriately choosing echo times, both the S+ and S− echoes of the MESS sequence contain sufficient information for 2-point Dixon water-fat separation. The echo times have been chosen such that the flexible 2-point Dixon method by Berglund et al could be applied. This method provides an analytical solution for two background field phasor candidates, from which a smooth background field phasor was constructed using low resolution region growing and Gaussian smoothing. After removal of the background field phasor from the signal, water and fat components were estimated by solving a linear least squares problem. Reference is made to Berglund J, Ahlström H, Johansson L, Kullberg J. Two-point dixon method with flexible echo times. Magn. Reson. Med. 2011; 65:994-1004 doi: 10.1002/mrm.22679.

The background field phasor resulting from water-fat separation of the S+ echoes was used to initialize the background field phasor for water-fat separation of the S− echoes. This forced the water-fat separation of both sets of echoes to be consistent, i.e. should a water-fat flip occur, it will likely be present in both sets of water and fat images.

In order for the field phasors of the S+ and S− echoes to be shared in this way, a quadratic phase correction has been performed before water-fat separation to ensure consistent phase behavior between the two sets of echoes. The assumption was made that echo 1 and 4 should have similar phase due to the symmetric sampling, and the same would hold for echo 2 and 3. Any major deviation in phase can be assumed to be caused by phase errors, for example caused by eddy currents or an imperfect $B_1$ field. A quadratic correction term was applied to each echo, which minimizes the phase difference between the respective echoes.

With water-fat separation two sets of water and fat images have been obtained, each with different $T_2$ weighting, similar to DESS. In DESS, $T_2$ mapping can be performed according the formula given by Sveinsson et al, solving for $T_2$ while correcting for known $T_1$ and flip angle:

$$\frac{|S^-|}{|S^+|} = e^{-\frac{2(TR-TE)}{T_2}} \sin^2\left(\frac{\alpha}{2}\right)\left(\frac{1+e^{-\frac{TR}{T_1}}}{1-\cos(\alpha)e^{-\frac{TR}{T_1}}}\right)$$

Here, we note that Sveinsson et al use a different definition of TE, compared to the definition of the echo times of the S+ and S− echoes, as used in the present disclosure.

In scans of the knee, the $T_1$ of articular cartilage is typically used in this correction for DESS with water-excitation. Reference is made to Sveinsson B, Chaudhari A S, Gold G E, Hargreaves B A. A simple analytic method for estimating T2 in the knee from DESS. Magn. Reson. Imaging 2017; 38:63-70 doi: 10.1016/j.mri.2016.12.018.

A confounding factor in MESS is that the water and fat images were reconstructed from two images with different echo times, thus making it difficult to choose a singular TE in the calculation. In order to determine an effective TE for the reconstructed water images, a simulation of the Dixon water-fat separation and $T_2$ estimation has been conducted to determine the TE that minimizes the mean squared errors in the water $T_2$ estimation using the aforementioned formula. In the simulation, the $T_2$ for water was varied between 10 and 50 ms, the $T_2$ for fat was varied between 100 and 200 ms, and the fat fraction was varied between 0 and 0.5. The effective TE for our MESS sequence was determined to be $0.39 TE_1 + 0.61 TE_2 \approx 5.4$ ms.

For each volunteer, the femoral and tibial cartilage were manually segmented on both the DESS and MESS images. In these regions the mean $T_2$ of water is measured using both DESS and MESS, using the optimized effective TE for the MESS $T_2$ quantification. The segmentations were also used to calculate the mean cartilage thickness.

FIGS. 5A and B shows the acquired MESS images for one of the subjects. FIGS. 5A and B respectively depict S+ and S− images of a knee obtained with the MESS sequence. FIG. 5A depicts from left to right the S+ echoes 1 and 2, and FIG. 5B depicts from left to right the S− echoes 3 and 4. The first set of two echoes (S+) of the MESS sequence display the T-weighted contrast from a conventional 2-echo Dixon acquisition, with in-phase and opposed-phase effects of water and fat. The second set of echoes (S−) show increased $T_2$ contrast in the cartilage and synovial fluid, although the fat signal in these images obscures a clear delineation of these structures. As expected from an acquisition with bipolar readouts, the fat signal was affected by small chemical-shift effects.

The water-fat separated MESS images are shown in FIG. 6A. The water-selective images from the DESS are shown as a reference for the water images from MESS. While it has been observed that the fat signal in the bone marrow was not as perfectly suppressed in the MESS water image compared to the DESS image, the fat images do show structure in the bone marrow, as well as contrast between bone marrow and cortical bone that was otherwise lost in the DESS sequence. Furthermore, in the DESS images some ghosting artifacts have been observed that were not present in the MESS images.

From the water-fat separated images, in-phase and opposed-phase contrasts were reconstructed, FIG. 6B. These images provide reliable contrasts regardless of the exact echo times used, and demonstrate an added value of Dixon water-fat separation. Finally, the water-fat separation yields $B_0$-phasors (i.e. phase-wrapped field maps), shown in FIG. 6B, which provide information on main magnetic field inhomogeneity and magnetic susceptibility. In one volunteer there was an incidental finding of a benign lesion, of which further radiological assessment determined it to be most likely a non-ossifying fibroma. Although on the water-selective DESS image the lesion appeared small and primarily containing fluid, the MESS fat images show that the bone marrow surrounding the lesion was also affected. These images also display the possibility of 3D multiplanar reformatting of both the DESS and MESS images, which have thinner slices than conventional protocols, reducing the need for multiple acquisitions with different image orientations.

TABLE 1

Mean $T_2$ and thickness quantification for the femoral and tibial cartilage for each subject and the overall mean (mean ± standard deviation).

| | | $T_2$ (ms) | | Thickness (mm) | |
|---|---|---|---|---|---|
| Subject | Sequence | Femoral | Tibial | Femoral | Tibial |
| 1 | DESS | 27.7 | 22.2 | 1.91 | 2.65 |
| | MESS | 27.2 | 18.0 | 1.99 | 2.56 |
| 2 | DESS | 29.4 | 22.9 | 1.89 | 2.08 |
| | MESS | 32.6 | 26.3 | 2.19 | 2.11 |
| 3 | DESS | 26.9 | 22.6 | 2.15 | 2.43 |
| | MESS | 27.5 | 22.1 | 2.23 | 2.45 |
| 4 | DESS | 25.7 | 24.6 | 2.41 | 2.38 |
| | MESS | 27.0 | 24.1 | 2.18 | 2.26 |
| 5 | DESS | 24.4 | 22.2 | 2.20 | 2.41 |
| | MESS | 24.6 | 19.6 | 2.02 | 2.41 |
| Mean | DESS | 26.8 ± 1.9 | 22.9 ± 1.0 | 2.11 ± 0.22 | 2.39 ± 0.20 |
| | MESS | 27.8 ± 3.0 | 22.0 ± 3.3 | 2.12 ± 0.11 | 2.36 ± 0.18 |

Figure 7:
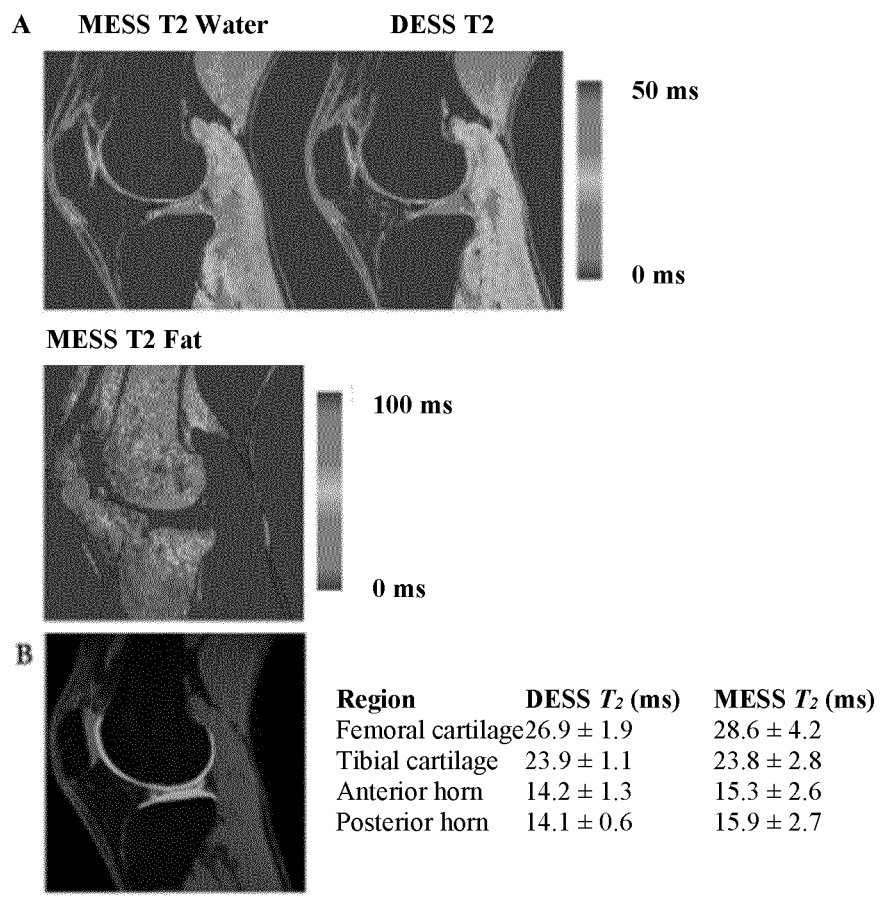

The mean cartilage $T_2$ and thickness values for the femoral and tibial cartilage for all subjects are shown in Table 1. On average, there was a small discrepancy (<5%) between $T_2$ quantification with DESS and MESS, although the MESS $T_2$ values did show slightly more variability. The mean cartilage thickness quantification showed marginal differences (<2%) between DESS and MESS quantification, and the values had similar variability. Visualizations of the $T_2$ and cartilage thickness quantification for both DESS and MESS are shown in FIG. 7. In the cartilage, DESS and MESS $T_2$ values showed good correspondence. In the muscle the $T_2$ was slightly lower on MESS than on DESS. The cartilage thickness visualization showed only minor differences between DESS and MESS.

FIGS. 7A and 7B depict exemplary T2 maps derived from DESS and MESS MRI sequences.

FIG. 7A depicts in the top row: left column MESS T2 water and right column DESS T2 water. In the second row of FIG. 7A, MESS T2 fat is depicted.

The MESS sequence provides a multi-echo extension of the DESS sequence that includes Dixon water-fat separation in addition to the $T_2$ quantification offered by DESS. Overall, both qualitatively and quantitatively, MESS images showed good correspondence with DESS images. Because of the water-fat separation, the MESS acquisition does not need to be fat-suppressed, and therefore provides both $T_1$- and $T_2$-weighted non-fat-suppressed images, as well as water, fat and fat-fraction maps, reconstructed in-phase and opposed-phase images, and a field map from the Dixon reconstruction. These additional contrasts and quantitative maps could prove useful for various applications, including diagnosis, treatment planning, and morphological analysis. For example, non-fat-suppressed images and fat images can provide additional information for differentiating lesions.

In principle, any DESS sequence with sufficiently long TR can be modified into a MESS sequence without any increase of scan time, although the echo times should be chosen such that they are appropriate for Dixon water-fat separation. The acquisition of more images in the same time results in lower SNR per image, but this had only a minor influence on the $T_2$ and cartilage thickness quantification. Because MESS is based on the DESS sequence, the quality of $T_2$ quantification was comparable. Manual segmentation of the cartilage in both DESS and MESS images resulted in similar cartilage thickness measures, demonstrating that DESS and MESS images were equivalent for this purpose, and potentially for other metrics derived from cartilage segmentations. FIG. 8 depicts a cartilage segmentation of a knee.

The MESS sequence as proposed used approximately double the readout bandwidth than that of the DESS sequence. The low bandwidth of the DESS sequence makes it susceptible to distortions due to magnetic field inhomogeneity, for example near metal implants. In the MESS sequence these distortions would be reduced by approximately a factor 2.

Furthermore, in principle the MESS acquisition provides sufficient information to correct for such distortions, for example with methods similar to those applied in EPI distortion correction.

In this study only a symmetric 4-echo variant of the MESS sequence has been considered, but the basic principles of the sequence can be extended to different echo configurations. For example, 6 echoes can be acquired to allow two 3-point Dixon reconstructions, which could improve the robustness of the water-fat separation and reduce artifacts from eddy currents. Another alternative to use 3-point Dixon is to acquire echoes asymmetrically, e.g. 3 S+ echoes and 1 S− echo. The acquisition of 3 or more echoes could also yield information on T2* or multi-exponential $T_2$ components.

For the 4-echo MESS sequence in this study a relatively simple 2-point Dixon water-fat separation has been used. This type of water-fat separation is available on most commercial scanners. Therefore, implementing MESS on a clinical system would only take minor software adaptations. A downside of this simple reconstruction is that it did not correct for chemical shift artifacts. The chemical shift between water and fat in our sequence was around 1.2 voxels, which can lead to artifacts in the water-fat separation, especially near boundaries between water and fat. More advanced Dixon methods could be applied to correct for such chemical shift artifacts. The MESS water-fat separation may also be improved by combining water-fat separation and $T_2$ fitting using all 4 echoes simultaneously, instead of reconstructing both sets of echoes independently.

Since MESS combines DESS with a Dixon sequence, the potential applications of MESS are a combination of the applications of these sequence. The water-selective DESS sequence was shown to be able to replace a conventional knee imaging protocol, which could potentially also be achieved with the water reconstructions of the MESS sequence.

Furthermore, recent deep learning-based cartilage segmentation techniques show promising results using DESS images. Similarly, Dixon imaging has been shown to be useful in musculoskeletal imaging, providing valuable morphological information on the full anatomy. Other applications of Dixon images include image segmentation and synthetic CT generation, which could additionally benefit from the multiple contrasts acquired with MESS. FIG. 9 depicts a deep learning-based synthetic CT obtained using a CNN model trained on MESS data. The output synthetic CT images show a clear CT-like contrast. The benefits can also translate to areas outside of musculoskeletal imaging. Efficient, co-registered multi-parametric imaging and synthetic CT would be well-suited for MR-only radiotherapy treatment planning, enabling both organ delineation and dosimetry.

With the 5-minute MESS acquisition, Dixon water-fat separation can be gained in the same time as a DESS acquisition. This study has shown good correspondence between DESS and MESS images. Furthermore, MESS efficiently provides information that is not available in the DESS sequence, including both $T_1$- and $T_2$-weighted non-fat-suppressed images and Dixon reconstructions. As such, MESS offers an interesting alternative to a DESS acquisition for use in abbreviated knee exams.

FIGS. 10, 11 and 12 show examples illustrating a clinical benefit from the MESS sequence and the contrasts that can be obtained from it in the pelvis area, including prostate, hip joints and sacroiliac joint. These areas are interesting from an orthopedic perspective as well as from an oncological perspective (prostate cancer).

The MESS sequence has been implemented on a 3 T scanner and acquired 2-echo GRE and 4-echo MESS images of the pelvis for one healthy volunteer. In these type of scans, total scan time should be minimized. Therefore, a relatively short repetition time was applied. The parameters for the GRE sequence were: TE1/TE2/TR=2.1 ms/3.5 ms/7 ms. The parameters for the 4-echo MESS sequence were matched to the GRE sequence, with the exception of: TE1/TE2/TE3/TE4/TR=2.1 ms/3.5 ms/6.3 ms/7.7 ms/9.8 ms.

FIG. 10 clearly shows the high resemblance of the S+ echoes of MESS to the 2 echoes of GRE. The S− echo show higher T2 weighting, expressed by the higher contrast of the prostate to its surroundings with respect to S+ images.

FIG. 10 depicts gradient echo images vs MESS images. The first 2 echoes (left) show the FID-like signal (S+) for MESS, which closely resemble the GRE echoes. The last 2 echoes (bottom-right) show the echo-like signal (S−), with a stronger T2 weighting. From left to right, the columns depict water (echo 1, S+), fat (echo 2, S+), water (echo 3, S−), and fat (echo 4, S−) respectively. The top row depicts gradient echo based images and the bottom row depicts MESS based images.

FIG. 11 illustrates a high resemblance of the water and fat reconstructions obtained from the S+ echoes of MESS to the water and fat reconstructions obtained from the 2 echoes of GRE. Furthermore, the second water image, obtained from the S− echoes, shows higher T2 weighting, expressed by the higher contrast of the prostate to its surroundings with respect to the first water image obtained with the S+ images. Dixon water-fat separation on the gradient echo sequence and both pairs of echoes (S+ and S−) of the MESS sequence are depicted in FIG. 11. A minor water-fat flip occurred in the S− echoes of the MESS, most likely caused by B1 differences between the S+ and S− echoes. From left to right, the columns depict water (echo 1, S+), fat (echo 2, S+), water (echo 3, S−), and fat (echo 4, S−) respectively. The top row depicts gradient echo based images and the bottom row depicts MESS based images.

FIG. 12 shows synthetic CT scans, obtained using a sCT-model trained with GRE data. It demonstrates that MESS data can be used to generate sCT reconstruction as input to a model trained to GRE data. Similarly, sCT can be obtained from MESS data using a sCT model trained with MESS data.

FIG. 12 illustrates deep learning-based synthetic CT from water and fat images of the gradient echo (GRE) and MESS sequences. The output synthetic CT images show a clear CT-like contrast with little artifacts. Furthermore a difference between the GRE and MESS synthetic CTs is minor, and mostly caused by interscan motion. Note that the network was not trained on MESS images, and performs well despite a different repetition time than the training GRE scans.

Network input is depicted in the first and second columns, depicting water in the first column and fat in the second column. Network output synthetic CT is depicted in the third column. Gradient echo based images are depicted in the top line and MESS based images in the bottom line.

The following numbered clauses form part of the description:

1. A method for generating a contrast image using MRI comprising a four-echo steady state free precession (SSFP) sequence, the method comprising:
   generating a pulse train of excitation pulses having a repetition time;
   generating between two subsequent excitation pulses of the pulse train a first S+ echo; a second S+ echo; a first S− echo; and a second S− echo;
   sampling between the two subsequent excitation pulses the first S+ echo; the second S+ echo; the first S− echo; and the second S− echo;
   generating the contrast image based on the sampled first S+ echo, the sampled second S+ echo, the sampled first S− echo, and the sampled second S− echo.

2. The method according to clause 1, wherein the contrast image comprises any contrast image from a group of contrast images comprising:
   a water-fat decomposed image,
   a quantitative relaxometry map,
   a phase based map, and
   a synthetic CT reconstruction.

3. The method according to clause 1 or 2, wherein the contrast image comprises any contrast image from a group of contrast images comprising:
   a T1w image,
   a T2w image,
   a mixed T1/T2w image,
   a water fraction image,
   a fat fraction image,
   an in-phase image,
   an opposed-phase image,
   a T2 map of a water fraction image,
   a T2 map of a fat fraction image,
   a T2 map general, and
   a T2* map general.

4. The method according to clause 3, wherein the group of contrast images further comprises:
   a B0 map, and
   a Chi map.

5. The method according to any one of the preceding clauses, wherein a time between the excitation pulse and an earliest one of the S+ echoes following the excitation pulse is equal to a time between a latest one of the S− echoes preceding the subsequent excitation pulse, and the subsequent excitation pulse.

6. The method according to any one of the preceding clauses, wherein a time between the earliest one of the S+ echoes and a latest one of the S+ echoes is equal to a time between an earliest one of the S− echoes and the latest one of the S− echoes.

7. The method according to any one of the preceding clauses, wherein a time integral of gradients in a readout direction in the repetition time is dimensioned to provide that the gradients in the readout direction in the repetition time induce one cycle of dephasing per voxel.

8. The method according to any one of the preceding clauses, wherein
   a readout polarity of the first S+ echo is opposite to a readout polarity of the second S+ echo, and
   a readout polarity of the first S− echo is opposite to a readout polarity of the second S− echo.

9. The method according to any one of the preceding clauses, further comprising at least one of:
   obtaining first water-fat decomposed signals based on a plurality of sampled first S+ echoes and a plurality of sampled second S+ echoes; and
   obtaining second water-fat decomposed signals based on a plurality of sampled first S− echoes and a plurality of sampled second S− echoes.

10. The method according to clause 9, wherein the first water-fat decomposed signals and the second water-fat decomposed signals are obtained using Dixon reconstruction.

11. The method according to clause 9 or 10, further comprising:
   generating a first set of water, fat, in-phase and out-phase images based on the first water-fat decomposed signals, wherein the first water, fat, in-phase and out-phase images have a mixed contrast weighting which is predominantly T1w weighted and is low T2(*) weighted.

12. The method according to clause 11, further comprising:
   generating a second set of water, fat, in-phase and out-phase images based on the second water-fat decomposed signals, wherein the second water, fat, in-phase and out-phase images have an increased T2 weighting and diffusion weighting compared to the first set of water, fat, in-phase and out-phase images.

13. The method according to any one of the preceding clauses, further comprising
   determining effective echo times associated with the S+ echoes and the S− echoes from echo times associated with the S+ echoes and the S− echoes and the repetition time; and
   generating, using the determined effective echo times, T2 maps associated with the individual S+ echo images and the individual S− echo images, wherein the T2 maps are calculated from an earliest one of the S+ echoes and a latest one of the S− echoes in the repetition time between subsequent excitation pulses and/or from a latest one of the S+ echoes and an earliest one of the S− echoes in the repetition time between subsequent excitation pulses.

14. The method according to any one of the preceding clauses, further comprising calculating effective echo times for the first set of water, fat, in-phase and out-phase images and for the second set of water, fat, in-phase and out-phase images, and calculating T2 maps of the water, fat, in-phase and out-of-phase images using the effective echo time for the first set of water, fat, in-phase and out-phase images and the second set of water, fat, in-phase and out-phase images.

15. The method according to any one of the preceding clauses, further comprising generating images with intermediate contrasts based on combining an image generated from a single one of the echo's with at least one generated contrast image.

16. The method according to any one of the preceding clauses, further comprising:
   providing the sampled first S+ echo, the sampled second S+ echo, the sampled first S− echo, and the sampled second S− echo to a statistical model;
   generating by the statistical model a synthetic CT image of the object based on one or more images chosen from the sampled first S+ echo, the sampled second S+ echo, the sampled first S− echo, and the sampled second S− echo.

17. The method according to clause 16, wherein the statistical model comprises a machine learning algorithm, wherein the machine learning algorithm is pre-trained using at least one of:
provided S+ data and associated CT images,
provided S− data and associated CT images,
provided S+ data, associated S− data and associated CT images,
provided S+ data and/or associated S− data and/or a contrast image from the group of contrast images, and
any other MRI data and associated CT images.

18. The method according to any one of the preceding clauses, wherein the machine learning algorithm comprises a neural network, in particular one of a convolutional neural network, an attention-aware network, a generative adversarial network and a graph convolutional network.

19. A method for generating a contrast image using MRI comprising a three-echo steady state free precession, SSFP, sequence, the method comprising:
generating a pulse train of excitation pulses having a repetition time;
generating between two subsequent excitation pulses of the pulse train a first S+ echo; a second S+ echo and a first S− echo;
sampling between the two subsequent excitation pulses the first S+ echo; the second S+ echo and the first S− echo;
generating the contrast image based on the sampled first S+ echo, the sampled second S+ echo and the sampled first S− echo.

20. The method according to clause 19, wherein the contrast image comprises any contrast image from a group of contrast images comprising:
a water-fat decomposed image,
a quantitative relaxometry map,
a phase based map, and
a synthetic CT reconstruction.

21. The method according to clause 19 or 20, wherein the contrast image comprises any contrast image from a group of contrast images comprising:
a T1w image,
a T2w image,
a mixed T1/T2w image,
a water fraction image,
a fat fraction image,
an in-phase image,
an opposed-phase image, and
a T2map general.

22. A control device for controlling a magnetic resonance imaging apparatus, the control device configured to control the magnetic resonance imaging apparatus to:
generate a pulse train of excitation pulses having a repetition time;
generate between two subsequent excitation pulses of the pulse train a first S+ echo; a second S+ echo; a first S− echo; and a second S− echo;
sample between the two subsequent excitation pulses the first S+ echo; the second S+ echo; the first S− echo; and the second S− echo; and
generate the contrast image based on the sampled first S+ echo, the sampled second S+ echo, the sampled first S− echo, and the sampled second S− echo.

23. A control device for controlling a magnetic resonance imaging apparatus, the control device configured to control the magnetic resonance imaging apparatus to:
generate a pulse train of excitation pulses having a repetition time;
generate between two subsequent excitation pulses of the pulse train a first S+ echo; a second S+ echo and a first S− echo;
sample between the two subsequent excitation pulses the first S+ echo; the second S+ echo and the first S− echo; and
generate the contrast image based on the sampled first S+ echo, the sampled second S+ echo and the sampled first S− echo.

24. An assembly of a magnetic resonance imaging apparatus and the control device for controlling the magnetic resonance imaging apparatus according to clause 22 or 23.

25. A software program comprising program instructions for, when run on a data processing device of a magnetic imaging apparatus, provide the magnetic imaging apparatus to perform the method according to any one of clauses 1-18 or the method according to any one of clauses 19-21.

The invention claimed is:

1. A method for generating a contrast image using MRI comprising a four-echo steady state free precession (SSFP) sequence, the method comprising:
generating a pulse train of excitation pulses having a repetition time;
generating between two subsequent excitation pulses of the pulse train a first S+ echo; a second S+ echo; a first S− echo; and a second S− echo;
sampling between the two subsequent excitation pulses the first S+ echo; the second S+ echo; the first S− echo; and the second S− echo;
generating the contrast image based on the sampled first S+ echo, the sampled second S+ echo, the sampled first S− echo, and the sampled second S− echo,
wherein the contrast image comprises a synthetic Computer Tomography, CT, image, and
wherein the method comprises, between the two subsequent excitation pulses,
generating a readout gradient of the first S+ echo and a readout gradient of the second S+ echo, wherein the readout gradients of the first S+ echo and second S+ echo have opposite polarities, and wherein a time integral of the readout gradient of the first S+ echo and a time integral of the readout gradient of the second S+ echo have a same absolute value,
generating a readout gradient of the first S− echo and a readout gradient of the second S− echo, wherein the readout gradients of the first S− echo and second S− echo have opposite polarities, and wherein a time integral of the readout gradient of the first S− echo and a time integral of the readout gradient of the second S− echo have a same absolute value,
wherein the readout gradient of a latest of the first and second S+ echo's and the readout gradient of an earliest of the first and second S− echo's have a same polarity and a same value of the time integral,
generating a dephasing gradient in a readout direction before an earliest of the first and second S+ echo's, and
generating a rephasing gradient in the readout direction after a latest of the first and second S− echo's,
wherein a time integral of the readout gradients, the dephasing gradient and the rephasing gradient over the repetition time provides for one cycle of dephasing per voxel.

2. The method according to claim 1, wherein the contrast image further comprises any contrast image from a group of contrast images comprising:
a water-fat decomposed image,
a quantitative relaxometry map,
a phase based map, and
a synthetic CT reconstruction.

3. The method according to claim 2, further comprising:
providing the sampled first S+ echo, the sampled second S+ echo, the sampled first S− echo, and the sampled second S− echo to a statistical model;
generating by the statistical model a synthetic CT image of the object based on one or more images chosen from the sampled first S+ echo, the sampled second S+ echo, the sampled first S− echo, and the sampled second S− echo.

4. The method according to claim 3, wherein the statistical model comprises a machine learning algorithm, wherein the machine learning algorithm is pre-trained using at least one of:
provided S+ data and associated CT images,
provided S− data and associated CT images,
provided S+ data, associated S− data and associated CT images,
provided S+ data and/or associated S− data and/or a contrast image from the group of contrast images, and
any other MRI data and associated CT images, wherein the machine learning algorithm comprises one of a convolutional neural network, an attention-aware network, a generative adversarial network and a graph convolutional network.

5. The method according to claim 1, wherein the contrast image further comprises any contrast image from a group of contrast images comprising:
a water-fat decomposed image,
a quantitative relaxometry map,
a phase based map,
a synthetic CT reconstruction,
a T1w image,
a T2w image,
a mixed T1/T2w image,
a water fraction image,
a fat fraction image,
an in-phase image,
an opposed-phase image,
a T2 map of a water fraction image,
a T2 map of a fat fraction image,
a T2 map general, and
a T2* map general.

6. The method according to claim 1, wherein the contrast image further comprises any contrast image from a group of contrast images comprising:
a water-fat decomposed image,
a quantitative relaxometry map,
a phase based map,
a synthetic CT reconstruction
a T1w image,
a T2w image,
a mixed T1/T2w image,
a water fraction image,
a fat fraction image,
an in-phase image,
an opposed-phase image,
a T2 map of a water fraction image,
a T2 map of a fat fraction image,
a T2 map general,
a T2* map general
a B0 map, and
a magnetic susceptibility map.

7. The method according to claim 1, wherein a time between the excitation pulse and an earliest one of the S+ echoes following the excitation pulse is equal to a time between a latest one of the S− echoes preceding the subsequent excitation pulse, and the subsequent excitation pulse, wherein a time between the earliest one of the S+ echoes and a latest one of the S+ echoes is equal to a time between an earliest one of the S− echoes and the latest one of the S− echoes.

8. The method according to claim 7, further comprising
determining effective echo times associated with the S+ echoes and the S− echoes from echo times associated with the S+ echoes and the S− echoes and the repetition time; and
generating, using the determined effective echo times, at least one T2 map associated with the individual S+ echo images and the individual S− echo images, wherein the at least one T2 map is calculated from an earliest one of the S+ echoes and a latest one of the S− echoes in the repetition time between subsequent excitation pulses and/or from a latest one of the S+ echoes and an earliest one of the S− echoes in the repetition time between subsequent excitation pulses.

9. The method according to claim 1, wherein a time integral of gradients in a readout direction in the repetition time is dimensioned to provide that the gradients in the readout direction in the repetition time induce one cycle of dephasing per voxel.

10. The method according to claim 1, wherein
a readout polarity of the first S+ echo is opposite to a readout polarity of the second S+ echo, and
a readout polarity of the first S− echo is opposite to a readout polarity of the second S− echo.

11. The method according to claim 1, further comprising at least one of:
obtaining first water-fat decomposed signals based on a plurality of sampled first S+ echoes and a plurality of sampled second S+ echoes; and
obtaining second water-fat decomposed signals based on a plurality of sampled first S− echoes and a plurality of sampled second S− echoes.

12. The method according to claim 11, wherein the first water-fat decomposed signals and the second water-fat decomposed signals are obtained using Dixon reconstruction.

13. The method according to claim 11, further comprising:
generating a first set of water, fat, in-phase and out-phase images based on the first water-fat decomposed signals, wherein the first water, fat, in-phase and out-phase images have a mixed contrast weighting which is predominantly T1w weighted and is low T2(*) weighted, the method further comprising:
generating a second set of water, fat, in-phase and out-phase images based on the second water-fat decomposed signals, wherein the second water, fat, in-phase and out-phase images have an increased T2 weighting and diffusion weighting compared to the first set of water, fat, in-phase and out-phase images.

14. The method according to claim 1, further comprising:
calculating effective echo times for a first set of water, fat, in-phase and out-phase images and for a second set of water, fat, in-phase and out-phase images, and calculating T2 maps of the water, fat, in-phase and out-of-phase images using the effective echo time for the first set of water, fat, in-phase and out-phase images and the second set of water, fat, in-phase and out-phase images; or generating images with intermediate contrasts based on combining an image generated from a single one of the echo's with at least one generated contrast image.

15. The method according to claim 1, wherein the contrast image comprises a water-fat separation image, the water-fat separation image being determined using the first and second S+ echo's, wherein the water-fat separation image are determined further using at least one of the first and second S− echo's.

16. The method according to claim 15, wherein a T2w image is derived from at least one of the first and second S− echo's, the synthetic Computer Tomography image being reconstructed from the T2w image and the water-fat separation image.

17. The method according to claim 1, wherein the rephasing gradient in the readout direction is further provided between the latest of the first and second S+ echo's and the earliest of the first and second S− echo's.

18. A method for generating a contrast image using MRI comprising a three-echo steady state free precession, SSFP, sequence, the method comprising:
  generating a pulse train of excitation pulses having a repetition time;
  generating between two subsequent excitation pulses of the pulse train a first S+ echo; a second S+ echo and a first S− echo;
  sampling between the two subsequent excitation pulses the first S+ echo; the second S+ echo and the first S− echo;
  generating the contrast image based on the sampled first S+ echo, the sampled second S+ echo and the sampled first S− echo;
  wherein the contrast image comprises a synthetic Computer Tomography, CT, image, and
  wherein the method comprises, between the two subsequent excitation pulses,
    generating a readout gradient of the first S+ echo and a readout gradient of the second S+ echo, wherein the readout gradients of the first S+ echo and second S+ echo have opposite polarities, and wherein a time integral of the readout gradient of the first S+ echo and a time integral of the readout gradient of the second S+ echo have a same absolute value,
    generating a readout gradient of the first S− echo,
    wherein the readout gradient of a latest of the first and second S+ echo's and the readout gradient of the first S− echo have a same polarity and a same value of the time integral,
    generating a dephasing gradient in a readout direction before an earliest of the first and second S+ echo's, and
    generating a rephasing gradient in the readout direction after the first S− echo, wherein a time integral of the readout gradients, the dephasing gradient and the rephasing gradient over the repetition time provides for one cycle of dephasing per voxel.

19. A control device for controlling a magnetic resonance imaging apparatus, the control device configured to control the magnetic resonance imaging apparatus to:
  generate a pulse train of excitation pulses having a repetition time;
  generate between two subsequent excitation pulses of the pulse train a first S+ echo; a second S+ echo; a first S− echo; and a second S− echo;
  sample between the two subsequent excitation pulses the first S+ echo; the second S+ echo; the first S− echo; and the second S− echo; and
  generate a contrast image based on the sampled first S+ echo, the sampled second S+ echo, the sampled first S− echo, and the sampled second S− echo,
wherein the contrast image comprises a synthetic Computer Tomography, CT, image, and
wherein the control device is further configured to control the magnetic resonance imaging apparatus to, between the two subsequent excitation pulses,
  generate a readout gradient of the first S+ echo and a readout gradient of the second S+ echo, wherein the readout gradients of the first S+ echo and second S+ echo have opposite polarities, and wherein a time integral of the readout gradient of the first S+ echo and a time integral of the readout gradient of the second S+ echo have a same absolute value,
  generate a readout gradient of the first S− echo and a readout gradient of the second S− echo, wherein the readout gradients of the first S− echo and second S− echo have opposite polarities, and wherein a time integral of the readout gradient of the first S− echo and a time integral of the readout gradient of the second S− echo have a same absolute value,
  wherein the readout gradient of a latest of the first and second S+ echo's and the readout gradient of an earliest of the first and second S− echo's have a same polarity,
  generate a dephasing gradient in a readout direction before an earliest of the first and second S+ echo's, and
  generate a rephasing gradient in the readout direction after a latest of the first and second S− echo's,
wherein a time integral of the readout gradients, the dephasing gradient and the rephasing gradient over the repetition time provides for one cycle of dephasing per voxel.

* * * * *